(12) United States Patent
Mecham et al.

(10) Patent No.: US 12,409,403 B2
(45) Date of Patent: Sep. 9, 2025

(54) SERVER DUST SENSOR AND FILTER MECHANISM

(71) Applicant: NVIDIA Corporation, Santa Clara, CA (US)

(72) Inventors: William Andrew Mecham, Elk Grove, CA (US); Ryan Kelsey Albright, Beaverton, OR (US); Aaron Richard Carkin, Hillsboro, OR (US); William Ryan Weese, Portland, OR (US); Benjamin Goska, Portland, OR (US); Michael Scott Thompson, Wilsonville, OR (US)

(73) Assignee: NVIDIA Corporation, Santa Clara, CA (US)

( * ) Notice: Subject to any disclaimer, the term of this patent is extended or adjusted under 35 U.S.C. 154(b) by 457 days.

(21) Appl. No.: 17/836,462

(22) Filed: Jun. 9, 2022

(65) Prior Publication Data
US 2023/0398483 A1 Dec. 14, 2023

(51) Int. Cl.
| | | |
|---|---|---|
| *B01D 46/46* | (2006.01) | |
| *B01D 46/44* | (2006.01) | |
| *G01N 15/06* | (2006.01) | |
| *G08B 21/18* | (2006.01) | |
| *H05K 5/02* | (2006.01) | |

(Continued)

(52) U.S. Cl.
CPC .......... *B01D 46/442* (2013.01); *B01D 46/46* (2013.01); *G01N 15/06* (2013.01); *G08B 21/18* (2013.01); *H05K 5/0213* (2013.01); *H05K 7/1488* (2013.01); *B01D 2279/45* (2013.01); *G01N 2015/0046* (2013.01); *G01N 15/075* (2024.01)

(58) Field of Classification Search
CPC .. B01D 46/442; B01D 46/46; B01D 2279/45; B01D 46/0086; B01D 46/429; G01N 15/06; G01N 15/075; G01N 2015/0046; G08B 21/18; G08B 27/001; G08B 19/00; G08B 21/12; H05K 5/0213; H05K 7/1488
See application file for complete search history.

(56) References Cited

U.S. PATENT DOCUMENTS

| | | | | |
|---|---|---|---|---|
| 3,839,848 A | * | 10/1974 | Wood ..................... | B01D 46/10 55/293 |
| 4,963,170 A | * | 10/1990 | Weber .................... | B01D 46/10 55/385.2 |

(Continued)

*Primary Examiner* — Dung H Bui
(74) *Attorney, Agent, or Firm* — Sheridan Ross P.C.

(57) ABSTRACT

Methods, devices, and systems automatically monitor and mitigate contamination caused by particulate in air that enters a server enclosure during operation. A particulate sensor detects an amount of particulate in the air and, when the amount exceeds a predetermined particulate limit value, a filter is automatically moved into an airflow path between an environment outside of the server enclosure and an environment inside the server enclosure. In this position, air entering the server enclosure is caused to pass through the filter when the predetermined particulate limit value is exceeded. In addition to active filtering, detected contamination across several units of scale is mapped to generate an air quality trend. The air quality trend provides information to technical personnel about contamination events and can aid in addressing the source of contamination before damage occurs to a server.

20 Claims, 7 Drawing Sheets

(51) Int. Cl.
*H05K 7/14* (2006.01)
*G01N 15/00* (2006.01)
*G01N 15/075* (2024.01)

(56) References Cited

U.S. PATENT DOCUMENTS

| | | | | |
|---|---|---|---|---|
| 5,013,333 | A * | 5/1991 | Beaufoy | E01H 1/0854 |
| | | | | 55/300 |
| 5,131,932 | A * | 7/1992 | Glucksman | F24F 11/39 |
| | | | | 55/471 |
| 5,174,797 | A * | 12/1992 | Yow, Sr. | B01D 46/46 |
| | | | | 95/286 |
| 5,315,838 | A * | 5/1994 | Thompson | F24F 8/10 |
| | | | | 116/272 |
| 5,647,889 | A * | 7/1997 | Stueble | B01D 46/10 |
| | | | | 95/20 |
| 6,913,637 | B2 * | 7/2005 | Kim | B01D 46/62 |
| | | | | 96/417 |
| 9,188,535 | B2 * | 11/2015 | Hanashi | G01N 15/1434 |
| 9,581,347 | B2 * | 2/2017 | Fiorita, Jr. | B01L 1/04 |
| 10,137,395 | B2 * | 11/2018 | Yoon | F24C 15/2092 |
| 10,393,714 | B2 * | 8/2019 | Wang | G01N 15/0205 |
| 11,959,407 | B2 * | 4/2024 | Ishii | F01N 3/36 |
| 2005/0022482 | A1 * | 2/2005 | Bockle | F24C 15/2035 |
| | | | | 55/321 |
| 2010/0015904 | A1 * | 1/2010 | Yeh | H05K 7/20181 |
| | | | | 55/511 |
| 2015/0101588 | A1 * | 4/2015 | Yoon | F24C 15/2092 |
| | | | | 126/299 D |
| 2015/0135661 | A1 * | 5/2015 | MacDonald | F24F 13/08 |
| | | | | 55/440 |
| 2018/0073389 | A1 * | 3/2018 | Zhang | F01D 21/003 |
| 2018/0207569 | A1 * | 7/2018 | Salpietra | B01D 46/0005 |
| 2018/0364266 | A1 * | 12/2018 | Browne | G01N 15/0205 |
| 2019/0022568 | A1 * | 1/2019 | Chernansky | H02B 13/025 |
| 2019/0046908 | A1 * | 2/2019 | Jeong | B01D 45/08 |
| 2019/0310696 | A1 * | 10/2019 | Campbell | G06F 1/206 |
| 2020/0141608 | A1 * | 5/2020 | Sinha | F24F 11/74 |
| 2020/0171414 | A1 * | 6/2020 | Lyon | B01D 35/143 |
| 2022/0203287 | A1 * | 6/2022 | Wenger | B01D 46/4227 |
| 2022/0203288 | A1 * | 6/2022 | Wenger | B01D 46/0036 |
| 2022/0373197 | A1 * | 11/2022 | Hyon | F24F 1/0073 |
| 2023/0029650 | A1 * | 2/2023 | Tayebi | F01D 21/003 |

* cited by examiner

SERVER DUST SENSOR AND FILTER MECHANISM

BACKGROUND

The present disclosure is generally directed to sensing and filtering, in particular, toward the mitigation, control, and management of particulate in server systems.

Servers and server products are typically housed in datacenters or other facilities including large climate controlled areas. Generally, these areas are not considered clean rooms (e.g., under International Organization for Standardization (ISO) 8, or lower, as defined by ISO 14644-1, etc.) and, as such, particulate matter concentration may vary according to the location of a facility and/or the location of a server in a given facility.

Particulate, such as dust, dirt, smoke, debris, or other matter that can be found in air, can pose a threat to server operation, reliability, and system performance. For instance, particulate matter that enters a server system can, over time, cause system deterioration via a number of methods including clogged and stuck fans, buildup and blockage of vents, and/or potential static discharge. In more severe cases, particulate dust buildup can cause catastrophic thermal failures by contacting various heat generating elements (e.g., chips, power supplies, etc.) and catching fire or by causing fans to operate below performance specifications resulting in the server components (e.g., circuits, etc.) operating at temperatures that are well above defined safety limits.

BRIEF SUMMARY

Example aspects of the present disclosure include:

A particulate mitigation and management system, comprising: a particulate sensor configured to detect an amount of particulate in air that is associated with an environmental space over time; an enclosure comprising an interior chamber and an airflow port disposed through at least one side of the enclosure and defining an airflow path extending from an exterior space outside of the enclosure to the interior chamber of the enclosure; an actuator configured to move between a first position and a second position; and a filter operatively connected to the actuator, the filter comprising at least one porous filtration substrate portion, wherein, in the first position, the at least one porous filtration substrate portion is arranged in the airflow path providing a filtered flow path between the exterior space and the interior chamber, wherein, in the second position, the at least one porous filtration substrate portion is arranged outside of the airflow path providing an unfiltered flow path between the exterior space and the interior chamber.

Any of the aspects herein, further comprising: a fan operatively coupled with the enclosure and configured to move air between the exterior space outside of the enclosure and the interior chamber of the enclosure via the airflow port when the actuator is in the first position and when the actuator is in the second position.

Any of the aspects herein, further comprising: a processor; and a memory coupled with and readable by the processor and storing therein instructions that, when executed by the processor, cause the processor to: receive a first particulate count corresponding to an amount of particulate in the air detected by the particulate sensor at a first time; determine, based on the first particulate count received, that the amount of particulate in the air at the first time is greater than a predetermined unfiltered particulate limit value; and send, automatically across a communication network, a first control signal to the actuator that causes the actuator to move into the first position.

Any of the aspects herein, wherein the instructions, when executed by the processor, further cause the processor to: receive a second particulate count corresponding to an amount of particulate in the air detected by the particulate sensor at a second time that is subsequent to the first time; determine, based on the second particulate count received, that the amount of particulate in the air at the second time is greater than a predetermined filterable particulate limit value; and send, automatically across a communication network, a second control signal that adjusts a power consumption of one or more circuits operating inside the enclosure.

Any of the aspects herein, wherein the instructions, when executed by the processor, further cause the processor to: receive a second particulate count corresponding to an amount of particulate in the air detected by the particulate sensor at a second time; determine, based on the second particulate count received, that the amount of particulate in the air at the second time is less than the predetermined unfiltered particulate limit value; and send, automatically across a communication network, a second control signal to the actuator that causes the actuator to move from the first position into the second position.

Any of the aspects herein, wherein the instructions, when executed by the processor, further cause the processor to: send, automatically across the communication network when the actuator is in the first position, a first speed control signal to the fan that sets a speed of the fan at a first speed; and send, automatically across the communication network when the actuator is in the second position, a second speed control signal to the fan that sets the speed of the fan at a second speed, wherein the second speed is lower than the first speed.

Any of the aspects herein, wherein the particulate sensor comprises: an interior particulate sensor disposed inside the interior chamber; and an exterior particulate sensor disposed in the exterior space.

Any of the aspects herein, wherein the particulate sensor comprises: a light transmitter; a photoelectric receiver; and one or more circuits configured to cause the light transmitter to output light toward the air in the environmental space and to cause the photoelectric receiver to receive at least a portion of the light output by the light transmitter and, based on a difference in an amount of the light output and an amount of the at least the portion of the light received, determine the amount of particulate in air in the environmental space at a time the one or more circuits cause the light transmitter to output light.

Any of the aspects herein, wherein the enclosure is a server rack, wherein the interior chamber comprises one or more circuits, and wherein the exterior space corresponds to a space in a server facility that houses the server rack.

Any of the aspects herein, wherein, prior to determining that the amount of particulate in the air at the first time is greater than a predetermined unfiltered particulate limit value, the instructions, when executed by the processor, further cause the processor to: determine an amount of particulate in the air detected by the interior particulate sensor at the first time; determine an amount of particulate in the air detected by the exterior particulate sensor at the first time; and determine, based on a comparison of the amount of particulate in the air detected by the interior particulate sensor at the first time and the amount of particulate in the air detected by the exterior particulate sensor at the first time, that a contamination is in the exterior space and is not in the interior chamber.

A method of mitigating a contamination of a controlled space, comprising: receiving data corresponding to counts of particulate in air that is associated with an environmental space over time; determining, based on the data received, that an amount of particulate in the air exceeds at least one predetermined particulate limit value; sending an alert signal that causes a communication device to render information about particulate measurements when the amount of particulate in the air exceeds a first predetermined particulate limit value; and sending a control signal that causes a particulate management system to automatically move at least one porous filter substrate into an airflow path between the controlled space and an exterior space outside of the controlled space when the amount of particulate in the air exceeds a second predetermined particulate limit value, wherein the second predetermined particulate limit value comprises a greater particulate count than the first predetermined particulate limit value.

Any of the aspects herein, wherein the controlled space corresponds to an interior chamber of a server, wherein the exterior space corresponds to a space outside of an enclosure of the server, and wherein the data is collected by at least one of an interior particulate sensor disposed inside the interior chamber and an exterior particulate sensor disposed in the exterior space.

Any of the aspects herein, further comprising; sending a power consumption adjustment signal that causes a particulate management system to adjust a power consumption of one or more circuits of the server operating inside the enclosure when the amount of particulate in the air exceeds a third predetermined particulate limit value, wherein the third predetermined particulate limit value comprises a greater particulate count than the second predetermined particulate limit value.

Any of the aspects herein, further comprising: providing the data as inputs to a machine learning model, wherein the inputs define historical particulate counts for the environmental space over time; receiving an output from the machine learning model, wherein the output received from the machine learning model is generated based on the machine learning model processing the inputs and includes an air quality trend for the environmental space; determining, based on the air quality trend, times associated with at least one contamination level for the environmental space; and sending, based on the times associated with the at least one contamination level, a communication signal to the particulate management system comprising at least one of the alert signal, the control signal, and the power consumption adjustment signal, wherein the communication signal is automatically selected based on the at least one contamination level.

Any of the aspects herein, wherein the communication is sent to the particulate management system prior to the times determined.

Any of the aspects herein, wherein the times associated with the at least one contamination level comprise a first time associated with a low contamination level having a first particulate count for the environmental space, a second time associated with a medium contamination level having a second particulate count that is higher than the first particulate count, and a third time associated with a high contamination level having a third particulate count that is higher than the second particulate count.

Any of the aspects herein, wherein the alert signal is sent to the particulate management system prior to the first time for the low contamination level, wherein the control signal is sent to the particulate management system prior to the second time for the medium contamination level, and wherein the power consumption adjustment signal is sent to the particulate management system prior to the third time for the high contamination level.

Any of the aspects herein, wherein the data is received in real time as the data is collected by one or more particulate sensors, and wherein the method further comprises: storing the data along with a timestamp and identification of each sensor of the one or more particulate sensors, wherein the identification of each sensor identifies a location of each sensor in the environmental space.

A server, comprising: at least one fan; an enclosure, comprising: an interior chamber disposed inside the enclosure; an air inlet disposed in a first portion of the enclosure, the air inlet defining an inlet port extending from an exterior space outside of the enclosure into the interior chamber; an air outlet disposed in a second portion of the enclosure, the air outlet defining an outlet port extending from the interior chamber to the exterior space outside of the enclosure, wherein the at least one fan causes air to flow from the exterior space through the enclosure along an airflow path running from the air inlet to the air outlet; a particulate sensor disposed at least partially inside the interior chamber, the particulate sensor configured to detect an amount of particulate in the air flowing through the enclosure over time; an actuator configured to move between a first position and a second position; and a filter operatively connected to the actuator, the filter comprising at least one porous filtration substrate portion, wherein, in the first position, the at least one porous filtration substrate portion is arranged in the airflow path providing a filtered flow path between the exterior space and the interior chamber, wherein, in the second position, the at least one porous filtration substrate portion is arranged outside of the airflow path providing an unfiltered flow path between the exterior space and the interior chamber.

Any of the aspects herein, wherein the at least one porous filtration substrate portion comprises a plurality of rectangular filters pivotally attached to the enclosure, wherein, upon receiving a filter-disengage control signal from a controller, the actuator moves from the first position to the second position pivoting the plurality of rectangular filters relative to the air inlet and out of the airflow path, wherein, upon receiving a filter-engage control signal from the controller, the actuator moves from the second position to the first position pivoting the plurality of rectangular filters relative to the air inlet and into the airflow path, wherein in the second position, the plurality of rectangular filters are arranged adjacent the inlet port, wherein the plurality of rectangular filters comprise a high efficiency particle air (HEPA) filter substrate, and wherein the HEPA filter substrate comprises an average particle filtration size between 0.3 microns and 5.0 microns.

Any one or more of the above aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

Any one or more of the features disclosed herein.

Any one or more of the features as substantially disclosed herein.

Any one or more of the features as substantially disclosed herein in combination with any one or more other features as substantially disclosed herein.

Any one of the aspects/features/embodiments in combination with any one or more other aspects/features/embodiments.

Use of any one or more of the aspects or features as disclosed herein.

It is to be appreciated that any feature described herein can be claimed in combination with any other feature(s) as described herein, regardless of whether the features come from the same described embodiment.

The details of one or more aspects of the disclosure are set forth in the accompanying drawings and the description below. Other features, objects, and advantages of the techniques described in this disclosure will be apparent from the description and drawings, and from the claims.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B, and C together. When each one of A, B, and C in the above expressions refers to an element, such as X, Y, and Z, or a class of elements, such as X1-Xn, Y1-Ym, and Z1-Zo, the phrase is intended to refer to a single element selected from X, Y, and Z, a combination of elements selected from the same class (e.g., X1 and X2) as well as a combination of elements selected from two or more classes (e.g., Y1 and Zo).

The preceding is a simplified summary of the disclosure to provide an understanding of some aspects of the disclosure. This summary is neither an extensive nor exhaustive overview of the disclosure and its various aspects, embodiments, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and configurations of the disclosure are possible utilizing, alone or in combination, one or more of the features set forth above or described in detail below.

Numerous additional features and advantages are described herein and will be apparent to those skilled in the art upon consideration of the following Detailed Description and in view of the figures.

BRIEF DESCRIPTION OF THE SEVERAL VIEWS OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples.

Further features and advantages will become apparent from the following, more detailed, description of the various aspects, embodiments, and configurations of the disclosure, as illustrated by the drawings referenced below.

DETAILED DESCRIPTION

Figure 1:
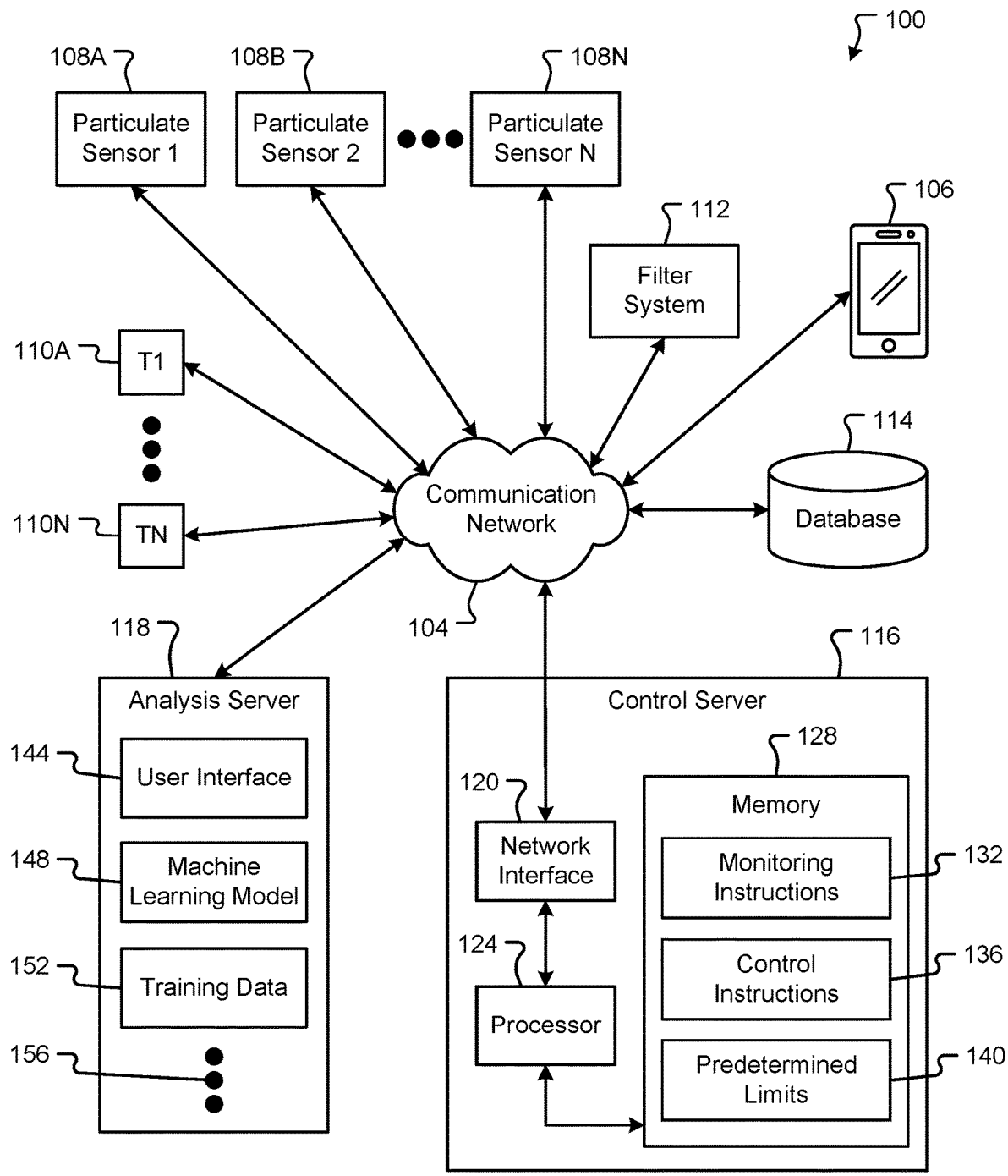
FIG. 1 is a block diagram of a particulate mitigation and management system in accordance with examples of the present disclosure.

It should be understood that various aspects disclosed herein may be combined in different combinations than the combinations specifically presented in the description and accompanying drawings. It should also be understood that, depending on the example or embodiment, certain acts or events of any of the processes or methods described herein may be performed in a different sequence, and/or may be added, merged, or left out altogether (e.g., all described acts or events may not be necessary to carry out the disclosed techniques according to different embodiments of the present disclosure). In addition, while certain aspects of this disclosure are described as being performed by a single module or unit for purposes of clarity, it should be understood that the techniques of this disclosure may be performed by a combination of units or modules associated with, for example, a computing device and/or a medical device.

In one or more examples, the described methods, processes, and techniques may be implemented in hardware, software, firmware, or any combination thereof. If implemented in software, the functions may be stored as one or more instructions or code on a computer-readable medium and executed by a hardware-based processing unit. Alternatively or additionally, functions may be implemented using machine learning models, neural networks, artificial neural networks, or combinations thereof (alone or in combination with instructions). Computer-readable media may include non-transitory computer-readable media, which corresponds to a tangible medium such as data storage media (e.g., random-access memory (RAM), read-only memory (ROM), electrically erasable programmable ROM (EEPROM), flash memory, or any other medium that can be used to store desired program code in the form of instructions or data structures and that can be accessed by a computer).

Instructions may be executed by one or more processors, such as one or more digital signal processors (DSPs), general purpose microprocessors (e.g., Intel Core i3, i5, i7, or i9 processors; Intel Celeron processors; Intel Xeon processors; Intel Pentium processors; AMD Ryzen processors; AMD Athlon processors; AMD Phenom processors; Apple A10 or 10X Fusion processors; Apple A11, A12, A12X, A12Z, or A13 Bionic processors; or any other general purpose microprocessors), graphics processing units (e.g., Nvidia GeForce RTX 2000-series processors, Nvidia GeForce RTX 3000-series processors, AMD Radeon RX 5000-series processors, AMD Radeon RX 6000-series processors, or any other graphics processing units), application specific integrated circuits (ASICs), field programmable logic arrays (FPGAs), or other equivalent integrated or discrete logic circuitry. Accordingly, the term "processor" as used herein may refer to any of the foregoing structure or any other physical structure suitable for implementation of the described techniques. Also, the techniques could be fully implemented in one or more circuits or logic elements.

Before any embodiments of the disclosure are explained in detail, it is to be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the present disclosure may use examples to illustrate one or more aspects thereof. Unless explicitly stated otherwise, the use or listing of one or more examples (which may be denoted by "for example," "by way of example," "e.g.," "such as," or similar language) is not intended to and does not limit the scope of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

It will be appreciated from the following description, and for reasons of computational efficiency, that the components of the system can be arranged at any appropriate location within a distributed network of components without impacting the operation of the system.

Further, it should be appreciated that the various links connecting the elements can be wired, traces, or wireless links, or any appropriate combination thereof, or any other appropriate known or later developed element(s) that is capable of supplying and/or communicating data to and from the connected elements. Transmission media used as links, for example, can be any appropriate carrier for electrical signals, including coaxial cables, copper wire and fiber optics, electrical traces on a Printed Circuit Board (PCB), or the like.

The terms "determine," "calculate," and "compute," and variations thereof, as used herein, are used interchangeably and include any appropriate type of methodology, process, operation, or technique.

Various aspects of the present disclosure will be described herein with reference to drawings that may be schematic illustrations of idealized configurations.

Server products, such as the DGX™ servers, systems, and workstations manufactured by NVIDIA, are usually housed in datacenters or other large, climate controlled areas. Generally, these areas are not considered clean rooms, for example, at ISO 8 or lower as defined by ISO 14644-1 and as can be appreciated, particulate matter concentration may vary according to each location. Particulate matter that enters a server system, computer, or workstation can, over time, cause system deterioration via multiple methods: clogged and stuck fans, buildup and blockage of vents, and/or potential static discharge. In some extreme cases, for example, where a dirty or high-particulate environment is not monitored and/or controlled, incidents could occur where dust or debris (e.g., particulate) may contact heat generating components of servers and catch fire (causing catastrophic thermal failures), or dust buildup could cause fans to behave below their performance specifications. Currently, the maintenance and monitoring of particulate relies on human operators and technicians to detect and counter contamination observed at a server, rack, pod, or datacenter. This human-reliance may leave sensitive systems vulnerable to potential hazards.

It is with respect to the above issues and other problems that the embodiments presented herein were contemplated.

The present disclosure provides methods, devices, and systems that can automatically sense and mitigate server contamination by dust and/or other small air particulate matter. As provided above, dust buildup and contamination can pose dangerous situations for high performance computer equipment. In some examples, the present disclosure describes an automatic system for contamination control including a method for detecting potential contamination at a server, rack, pod, or datacenter level along with a method to react with alerts and filtration measures to prevent further contamination. In some examples, the present disclosure describes methods and systems for detecting and mitigating contamination, and creating a mapping of detected contamination across several units of scale to provide feedback and guidance to DevOps and/or other technical personnel to find and address the source of contamination.

In some examples, the systems described herein may accept input from a myriad of different particle sensors. One example of a suitable particle sensor that may be employed in the implementations described herein may include, but are in no way limited to, the model PMSA003 digital laser dust sensor manufactured by PlanTower of Beijing, China. The model PMSA003 particulate sensor, is a laser scatter sensor that is capable of detecting particles that are between 1.0 µm and 10.0 µm (e.g., 1.0 µm, 2.5 µm, 10.0 µm, etc.) in size. Other particulate sensors may be used that are capable of detecting particles in air and/or an environment without departing from the scope of the present disclosure. Continuing the present example, however, a series of model PMSA003 sensors may be installed inside of a datacenter at the system, rack, row, and pod level. Readings (e.g., particulate measurements defining an amount of particulate in the air, etc.) may be received by a control server on a regular basis (e.g., periodically, continually, or at predetermined intervals, etc.) to measure overall particulate matter. In some examples, the control server may request the readings from the sensors and/or a controller of the sensors. If the measurements exceed a configured limit (e.g., at least one predetermined particulate limit value, etc.), one or more of the following actions can be taken, depending on configuration: 1) an alert may be sent to facility (e.g., datacenter, etc.) operations, maintenance, or other sources indicating the particulate measurements measured; 2) filters (e.g., high efficiency particulate air (HEPA) filter, or other style of particulate filter, etc.) may be mechanically moved into place over server, rack, or facility air inlets (e.g., air intake ports, etc.) while the situation persists; 3) a system load may be limited or the system may be shut down should the contamination be severe (e.g., via sending a power consumption adjustment signal to the server, server equipment, etc.), 4) other actions as configured by facility operations and/or other technical personnel.

In some examples, an active filtration method may be performed by the systems described herein. For instance, if an alert is sent indicating a contamination issue is present, active measures can be taken by the control system to filter server air inlets. In at least one embodiment, louvers may rotate to cover the cold aisle air intake of a server system with one or more HEPA filters, blocking dust from entering the rack via standard airflow and helping to clean the air cycling through the rack. In some examples, a louver system may comprise filters that are associated with each louver. Each louver may be equal to 1U (e.g., one rack unit) in server rack height. When the louver is closed, the filter provides additional air filtration for the server (e.g., greater than an air filtration when the louver is open, etc.). In some examples, as air enters the server the air quality value of the air (e.g., particulate count/amount, etc.) may be determined by a sensor. The air quality value from the sensor may then be transmitted to a control server or monitoring system. The control server or monitoring system may then determine if the air entering the server is of an acceptable quality (e.g., within predetermined particulate limit values, etc.). When the air quality is unacceptable (e.g., outside of the predetermined particulate limit values, etc.), the control system may inform the HEPA filter system (e.g., active filters, etc.) to engage.

In some examples, dust mapping and particulate trends (e.g., air quality trends, etc.) may be determined for an environmental space using the methods and systems described herein. For example, data collected from the example sensors may be used to form an accurate real-time mapping of contaminants in the facility (e.g., datacenter, etc.) at any level managed by the operations team or other personnel. These maps can be useful for pinpointing the source of an emergency event. The maps may also be fed (e.g., as inputs, etc.) to a machine learning algorithm to track patterns of contaminants over time, regardless of levels, to show where remediation may be needed for potentially problematic or persistently problematic areas. For example, air quality from any number of system sensors and air quality from any number of room locations may be fed to a control system. The control system may check for emergency events and upload the sensor data to a database. An analysis system may gather the sensor data from the database at a defined interval and feeds the data (e.g., as inputs) to a machine learning algorithm for analysis of air quality trends on the combined room and system data. The results may then be fed to a communication device, status dashboard, or other means of display for datacenter operations personnel to review and act upon.

Among other things, the present disclosure describes using various environmental sensors (e.g., temperature sensors, humidity sensors, particulate sensors, etc.) to monitor the quality of the air being fed to and through server equipment with the ability for a control server to determine the best course of action should an alarm be raised, up to and including human response alerts, filter application, or emergency shutdown. The control system may feed data to an analysis server that parses the data for air quality trends and other environmental information.

Although contamination events may be rare occurrences, the events can result in large productivity losses and impacts to uptime and machine maintenance schedules. The methods and systems described herein are capable of tracking real-time events as well as use the gathered data to mitigate current and future issues and are able to decrease maintenance and downtime.

Referring now to FIG. 1, a block diagram of a particulate mitigation and management system 100 is shown in accordance with examples of the present disclosure. The particulate mitigation and management system 100 may include one or more particulate sensors 108A-108N that are associated with an environmental space. Each particulate sensor 108A-108N may be configured to detect an amount of particulate in air (e.g., particulate count, etc.) of the environmental space. One example of the particulate sensors 108A-108N may include, but are in no way limited to, the model PMSA003 digital laser dust sensor manufactured by PlanTower of Beijing, China. The environmental space may correspond to any space inside a facility or datacenter, such as space inside a server (e.g., inside an enclosure of a server rack, etc.), space in a hallway, space in a room, space in a datacenter, and/or space adjacent the same. Although described as being disposed in or about a facility, in some examples, one or more of the particulate sensors 108A-108N may be disposed outside of a facility. In these outside positions, the particulate mitigation and management system 100 may receive data according to an environmental condition that is outside of the facility. In one example, such data may be used to determine the source of contamination, take early action (e.g., engaging filters, reallocating resources, reducing power consumption, etc.) before the contamination reaches the servers in the facility, and/or the like.

Other environmental condition sensors 110A-110N may be arranged inside and/or outside of a facility or server system. The environmental condition sensors 110A-110N may include, but are in no way limited to, one or more temperature sensors (e.g., thermocouples, thermometers, etc.), humidity sensors, moisture meters, pressure sensors, vibration sensors, light sensors, sound sensors, capacitive sensors, current sensors, airflow sensors, combinations thereof, etc. In some examples, the environmental condition sensors 110A-110N may provide data about an environmental space in which the environmental condition sensors 110A-110N are placed that define an environmental condition of the environmental space. For instance, the environmental condition sensors 110A-110N may detect, or measure values of, a temperature, humidity, and pressure in one or more spaces of a datacenter. These measured values may be used alone or in combination with the particulate sensors 108A-108N to determine an emergency event, determine a susceptibility to a contamination or particulate, or predict a contamination event for the facility, server system, and/or other device in the particulate mitigation and management system 100. By way of example, a first environmental condition sensor 110A may be disposed inside an enclosure (e.g., rack) of a server system. In this example, the first environmental condition sensor 110A may report a temperature inside the enclosure that is increasing over time. This increase in temperature may be associated with power consumption of the server components (e.g., one or more circuits, etc.) operating inside the enclosure, a load placed on the server, and/or the like. As the one or more circuits continue to generate heat, the server may be determined to be more susceptible to additional particulate that enters the enclosure. In this case, although the current particulate count of the air may be somewhat low (e.g., falling within predetermined acceptable nominal limits, etc.) the current particulate count may be too high (e.g., exceeding predetermined acceptable temperature-based limits, etc.) given the temperature inside the enclosure. Similar determinations may be made based on humidity and/or pressure levels determined by other environmental condition sensors 110A-110N. In any event, the particulate mitigation and management system 100 may determine to take action based on the information received from the environmental condition sensors 110A-110N.

Data from the particulate sensors 108A-108N and/or the environmental condition sensors 110A-110N may be sent over a communication network 104 to a communication device 106, a control server 116, and/or an analysis server 118. The communication network 104 may comprise any type of known communication medium or collection of communication media and may use any type of protocols to transport messages between endpoints. The communication network 104 may include wired and/or wireless communication technologies. The Internet is an example of the communication network 104 that constitutes an Internet Protocol ("IP") network consisting of many computers, computing networks, and other communication devices located all over the world, which are connected through many telephone systems and other means. Other examples of the communication network 104 include, without limitation, a standard Plain Old Telephone System ("POTS"), an Integrated Services Digital Network ("ISDN"), the Public Switched Telephone Network ("PSTN"), a Local Area Network ("LAN"), a Wide Area Network ("WAN"), a VoIP network, a Session Initiation Protocol ("SIP") network, a cellular network, and any other type of packet-switched or circuit-switched network known in the art. In addition, it can be appreciated that the communication network 104 need not be limited to any one network type, and instead may be comprised of a number of different networks and/or network types. The communication network 104 may comprise a number of different communication media such as coaxial cable, copper cable/wire, fiber-optic cable, antennas for transmitting/receiving wireless messages, optical/infrared, and combinations thereof.

In some example implementations, the communication device 106 may correspond to a computing device, a personal communication device, a portable communication device, a laptop, a smartphone, a tablet, a personal computer, and/or any other communication device capable of running an operating system ("OS"), at least one application, communication instructions, and/or the like. The communication device 106 may be configured to operate various versions of Microsoft Corp.'s Windows® OS and/or Apple Corp.'s Macintosh® OS, any of a variety of commercially-available UNIX® OS such as LINUX or other UNIX-like OS, iOS, Android®, etc. The communication device 106, may also have any of a variety of applications, including for example, browser applications, chat applications, calling applications, email applications, etc., and/or combinations thereof. Additionally or alternatively, the communication device 106, in some implementations, may be any electronic device, such as a computer terminal and/or a personal digital assistant, capable of communicating via the communication network 104.

The control server 116 may include hardware and/or software resources that, among other things, provides the ability for controlling messages the communication device 106, the filter system 112, and/or servers in a facility based on data received from the particulate sensors 108A-108N, the environmental condition sensors 110A-110N, and/or the analysis server 118. Among other things, the control server 116 may provide messaging functionality that allows signals to be sent and received between the control server 116 and the components of the particulate mitigation and management system 100. The control server 116 may include a network interface 120, a processor 124, and a memory 128. The memory 128 may comprise monitoring instructions 132, control instructions 136, predetermined limits 140, and/or the like.

The network interface 120 provides the control server 116 with the ability to send and receive communication packets or the like over the communication network 104. The network interface 120 may be provided as a network interface card ("NIC"), a network port, a modem, drivers for the same, and the like. Communications between the components of the control server 116 and other devices connected to the communication network 104 may flow through the network interface 120 of the control server 116. In some implementations, examples of a suitable network interface 120 include, without limitation, an antenna, a driver circuit, an Ethernet port, a modulator/demodulator, an NIC, an RJ-11 port, an RJ-45 port, an RS-232 port, a USB port, etc. The network interface 120 may include one or multiple different network interfaces depending upon whether the control server 116 is connecting to a single communication network or multiple different types of communication networks. For instance, the control server 116 may be provided with both a wired network interface and a wireless network interface without departing from the scope of the present disclosure. In some examples, the network interface 120 may include different communications ports that interconnect with various input/output lines.

In some examples, the processor 124 may correspond to one or more computer processing devices. For example, the processor 124 may be provided as silicon, an Application-Specific Integrated Circuit (ASIC), as a Field Programmable Gate Array (FPGA), any other type of Integrated Circuit (IC) chip, a collection of IC chips, and/or the like. In some examples, the processor 124 may be provided as a Central Processing Unit (CPU), a microprocessor, or a plurality of microprocessors that are configured to execute the instructions sets stored in memory 128. Upon executing the instruction sets stored in memory 128, the processor 124 enables various monitoring functions (e.g., determinations of particulate counts for the environmental space, etc.), control functions (e.g., sending control signals to one or more devices in the particulate mitigation and management system 100, etc.), and/or interaction functions of the control server 116, and may provide an ability to send and receive communications between devices of the particulate mitigation and management system 100 when specific conditions are met.

The memory 128, or storage memory, may correspond to any type of non-transitory computer-readable medium. In some example implementations, the memory 128 may comprise volatile or non-volatile memory and a controller for the same. Non-limiting examples of the storage memory 128 that may be utilized in the control server 116 may include Random Access Memory ("RAM"), Read Only Memory ("ROM"), buffer memory, flash memory, solid-state memory, or variants thereof. Any of these memory types may be considered non-transitory computer memory devices even though the data stored thereby can be changed one or more times. The memory 128 may be used to store information about counts of particulate in air associated with one or more environmental spaces over time, temperatures, pressures, humidity levels, predetermined limits (e.g., particulate limits, unfiltered particulate limits, filterable particulate limits, etc.), and/or the like. In some embodiments, the memory 128 may be configured to store rules and/or the instruction sets depicted in addition to temporarily storing data for the processor 124 to execute various types of routines or functions. Although not depicted, the memory 128 may include instructions that enable the processor 124 to store data into a database 114 and retrieve information from the database 114. In some embodiments, the database 114 or the data stored therein may be stored internal to the control server 116 (e.g., within the memory 128 of the control server 116 rather than in a separate database) or in a separate server.

The monitoring instructions 132, when executed by the processor 124, may provide the ability for the control server 116 to receive data corresponding to environmental conditions (e.g., detected by the one or more environmental condition sensors 110A-110N, etc.) and/or receive data corresponding to counts of particulate in air that are associated with an environmental space over time (e.g., detected by the one or more particulate sensors 108A-108N, etc.). The control server 116 and the processor 124 executing the monitoring instructions 132 may enable data request signals and messaging to be exchanged between the control server 116 and the particulate sensors 108A-108N and/or the environmental condition sensors 110A-110N, etc. A data request signal may request a detected measurement of the particulate sensors 108A-108N at a particular time. In some examples, the particulate sensors 108A-108N and/or the environmental condition sensors 110A-110N may periodically send data to the control server 116 without the control server 116 requesting the data. Examples of other functions performed via the monitoring instructions 132, when executed by the processor 124, include, but are in no way limited to, determining whether received data exceeds the predetermined limits 140 stored in the memory 128, storing data received in the database 114, sending the data received to the analysis server 118, and/or combinations thereof.

The control instructions 136, when executed by the processor 124, may provide the ability for the control server 116 to control one or more of the devices and/or systems of the particulate mitigation and management system 100. For example, in response to determining that an amount of particulate in the air exceeds at least one predetermined particulate limit value, the control instructions 136, when executed by the processor 124, may cause the control server 116 to send at least one control signal across the communication network 104.

In some examples, the control signal and control instructions 136, when executed by the processor 124, may cause the control server 116 to send an alert signal across the communication network 104 to the communication device 106 that causes the communication device 106 to render information about particulate measurements when the amount of particulate in the air exceeds a first predetermined particulate limit value. The control instructions 136 may cause applications, web pages, pop-ups, and/or other digital interactions to be presented by a display device of the communication device 106.

In some examples, the control instructions 136 may cause the control signal to be sent across the communication network 104 to the filter system 112. For example, the control signal may cause a filter of the filter system 112 to be actuated into an airflow path that flows between an area inside and an outside of a server system (e.g., causing air entering the enclosure of the server system to be filtered by the filter, etc.). Additionally or alternatively, the control signal may cause a fan speed of one or more air handling fans associated with the filter system 112 of the server to be altered. For instance, when the filter is actuated to be in the airflow path, the fan speed may be increased from a first speed to a higher second speed to allow higher airflow throughout the server (e.g., as opposed to using the same fan speed in both the filter actuated and unactuated states). As can be appreciated, the control instructions 136, when executed by the processor 124, may send control signals that cause opposite actions than described above based on changes in the amount of particulate in the air detected by the particulate sensors 108A-108N over time. For example, when the amount of particulate in the air is detected within acceptable predetermined particulate limit values, the control instructions 136, when executed by the processor 124, may send a control signal that actuates, or moves, the filter out of the airflow path and/or decreases the fan speed from the second speed to the lower first speed.

In some examples, the control signal and control instructions 136, when executed by the processor 124, may cause the control server 116 to send a power consumption adjustment signal that causes the particulate mitigation and management system 100 to adjust a power consumption of one or more circuits of the server operating inside the enclosure when the amount of particulate in the air exceeds a specific predetermined particulate limit value. Examples of the power consumption adjustment signal may include, but are in no way limited to, a signal that causes the one or more circuits to reduce a clock speed from a first value to a lower second value and/or terminate operations partially or completely. In this example, the specific predetermined particulate limit value may include a greater particulate count than the predetermined particulate limit value associated with the other signals. As described above, the control instructions 136, when executed by the processor 124, may send control signals that cause opposite actions than described based on changes in the amount of particulate in the air detected by the particulate sensors 108A-108N over time. For instance, when the amount of particulate detected in the air is determined to be within acceptable predetermined particulate limit values, the control instructions 136, when executed by the processor 124, may send a control signal that increases a clock speed from the second value to the higher first value and/or startup one or more previously terminated operations.

The control instructions 136, when executed by the processor 124, may cause any of the control signals described above to be sent at the same time, at different times, and/or at combinations of times as defined in the predetermined limits 140 and by particulate limit values. The control instructions 136 may work in conjunction with the monitoring instructions 132, or vice versa, to perform at least some steps of the methods described in conjunction with FIGS. 6-8, and as otherwise described herein.

The predetermined limits 140 may include at least one predetermined particulate limit value and associated state of the particulate mitigation and management system 100. The predetermined particulate limit value may define various levels of acceptable particulate counts for an environmental space based on one or more mitigation and management conditions or states. In some examples, the predetermined particulate limit values may be tiered based on particular control and/or alert responses taken by the particulate mitigation and management system 100.

For example, a first predetermined particulate limit value may correspond to an amount of particulate in the air that is determined to be a precursor to a second predetermined particulate limit value where filtering of the air in the environmental space may be required. The predetermined limits 140 may define that the first predetermined particulate limit value requires the control server 116 to send an alert signal to one or more communication devices 106 of the particulate mitigation and management system 100. The alert signal may cause the communication device 106 to render information about the detected particulate count, instructions to mitigate or control contamination, and/or other information that may help operations personnel discover or otherwise be made aware of a contamination event or a potential contamination event.

In some examples, a second predetermined particulate limit value may correspond to an amount of particulate in the air that is determined to require filtering of air in the environmental space (e.g., air that enters the server, rack, and/or other enclosure). The predetermined limits 140 may define that the second predetermined particulate limit value requires the control server 116 to send a control signal to the filter system 112 and/or the server of the particulate mitigation and management system 100. The control signal may cause the filter system 112 to actuate a filter into an airflow path between an exterior of the server and the interior of the server (e.g., housing one or more circuits of the server, etc.). Actuating the filter system 112 causes air to pass through a filter of the filter system 112 before entering the interior of the server. In some examples, the second predetermined particulate limit value may require that the control server 116 send a control signal to one or more fans of the filter system 112 when the filter is disposed in the airflow path.

In some examples, a third predetermined particulate limit value may correspond to an amount of particulate in the air that is determined to be incapable of filtering and/or that is above a limit where the server can operate while the filter is in the airflow path. The predetermined limits 140 may define that the third predetermined particulate limit value requires the control server 116 to send a control signal to the server of the particulate mitigation and management system 100. The control signal may cause the server to reduce a power consumption level, terminate operations, or produce less heat than when in a standard low-particulate state (e.g., when the particulate mitigation and management system 100 is within the first predetermined particulate limit and/or the second predetermined particulate limit, etc.). In some examples, the third predetermined particulate limit value may require that the control server 116 send a control signal to one or more other servers where the particulate amount is within acceptable limits to operate in lieu of the server where the third predetermined particulate limit value has been exceeded. This type of control signal may be referred to herein as resource reallocation.

The analysis server 118 may comprise a user interface 144, a machine learning model 148, training data 152, and more 156. In some examples, data collected from the particulate sensors 108A-108N and/or the environmental condition sensors 110A-110N may be provided as inputs to the machine learning model 148. This data may be retrieved from the database 114 by the analysis server 118. In some implementations, the data may be stored in the training data 152 of the analysis server 118. Although not shown, the analysis server 118 may comprise a network interface 120, processor 124, and a memory 128 that are the same, or similar, as described in conjunction with the control server 116. Additionally or alternatively, in some examples, the functions of the analysis server 118 may be provided by the control server 116.

In some examples, one or more processors of the analysis server 118 (e.g., processor 124, etc.) may support the machine learning model 148 which may be trained and/or updated based on data (e.g., training data 152, etc.) provided or accessed by any of the database 114, control server 116, and particulate sensors 108A-108N. The machine learning model 148 may be built and updated by based on the training data 152 (also referred to herein as training data and feedback). In some examples, the training data 152 may include multiple training sets.

For example, the machine learning model 148 may be trained with a first training set that includes particulate counts for one or more environmental spaces over time (e.g., accessed from database 114 or control server 116) where a contamination event (e.g., a threshold or value being exceeded, a failure, a performance indicator falling below specifications, etc.) was determined to occur.

The machine learning model 148 may be trained with a second training set that includes particulate counts for one or more environmental spaces over time (e.g., accessed from database 114 or control server 116) where a contamination event (e.g., a threshold or value being exceeded, a failure, a performance indicator falling below specifications, etc.) was determined not to occur.

In an example, the machine learning model 148 may be trained with a third training set that includes particulate counts for one or more environmental spaces over time (e.g., accessed from database 114 or control server 116) and an airflow pattern throughout a facility where the particulate counts increase space-by-space according to a vector, or combination of vectors, indicating a spread of contamination in facility.

The machine learning model 148 may be provided in any number of formats or forms. Nonlimiting examples of the machine learning model 148 may include, but are in no way limited to, Decision Trees, gradient-boosted decision tree approaches (GBMs), Support Vector Machines (SVMs), Nearest Neighbor, and/or Bayesian classifiers, and neural-network-based approaches to name a few.

In an example, the machine learning model 148 may include ensemble classification models (also referred to herein as ensemble methods) such as GBMs. Gradient boosting techniques may include, for example, the generation of decision trees one at a time within a model, where each new tree may support the correction of errors generated by a previously trained decision tree (e.g., forward learning). Gradient boosting techniques may support, for example, the construction of ranking models for information retrieval systems. A GBM may include decision tree-based ensemble algorithms that support building and optimizing models in a stage-wise manner.

According to example implementations of the present disclosure described herein, the machine learning model 148 may include Gradient Boosting Decision Trees (GBDTs). Gradient boosting is a supervised learning technique that harnesses additive training and tree boosting to correct errors made by previous models, or regression trees.

The machine learning model 148 may include extreme gradient boosting (CatBoost) models. CatBoost is an ensemble learning method based on GBDTs. In some cases, CatBoost methods may have improved performance compared to comparable random forest-based methods. CatBoost methods are easily tunable and scalable, offer a higher computational speed in comparison to other methods, and are designed to be highly integrable with other approaches including Shapley Additive Explanations (SHAP) values.

In some examples, the machine learning model 148 may include ensemble classification models (also referred to herein as ensemble methods) such as random forests. Random forest techniques may include independent training of each decision tree within a model, using a random sample of data. Random forest techniques may support, for example, air quality trend determinations described herein using weighting techniques with respect to different data sources.

Various example aspects of the machine learning model 148, inputs to machine learning model 148, and the training data 152 with respect to the present disclosure are described herein. The training data 152 may include, but is in no way limited to, at least one of detected particulate counts, temperatures, pressures, and humidity levels in an environmental space, sensor identification for each of the particulate sensors 108A-108N and/or environmental condition sensors 110A-110N in the environmental space, location information for each sensor 108A-108N, 110A-110N in the particulate mitigation and management system 100, historical measurement and detection data, data about environmental and ambient conditions, data about environmental events (e.g., storms, forest fires, fires, volcanic eruptions, pollen counts, etc.), air handling or conditioning operational status, server performance per Watt, and the like.

In some examples, at least one of the communication device 106, the control server 116, and/or the analysis server 118 may include a user interface 144 and/or a display device. The user interface 144 may correspond to any type of input and/or output device, or combination thereof, that enables a user or operator to interact with the device/server. As can be appreciated, the nature of the user interface 144 may depend upon the nature of the device/server. Examples of the user interface 144 may include, but are in no way limited to, user interface hardware and devices such as at least one touch-sensitive display elements, buttons, switches, keyboards, peripheral interface devices (e.g., mice, controller, joysticks, etc.) as described herein. It is an aspect of the present disclosure that one or more devices in the user interface 144 may provide an input that is interpreted by the processor of the device/server (e.g., processor 124, etc.) in controlling one or more components of the device/server. The display device of at least one of the communication device 106, the control server 116, and/or the analysis server 118 may comprise at least one display screen that selectively activates pixels and/or display elements to render one or more applications, windows, controls, interactive elements, icons, characters, images, etc. Examples of the display screen may include, but are in no way limited to, a Liquid Crystal Display (LCD), a Light Emitting Diode (LED) display, an Electroluminescent Display (ELD), an Organic LED (OLED) display, and/or some other type of display. In some embodiments, the display device may be configured to render information in one or more discrete areas (e.g., backgrounds, portions, windows, zones, etc.) of the display screen or superimposed in an area of the display screen.

Figure 2:
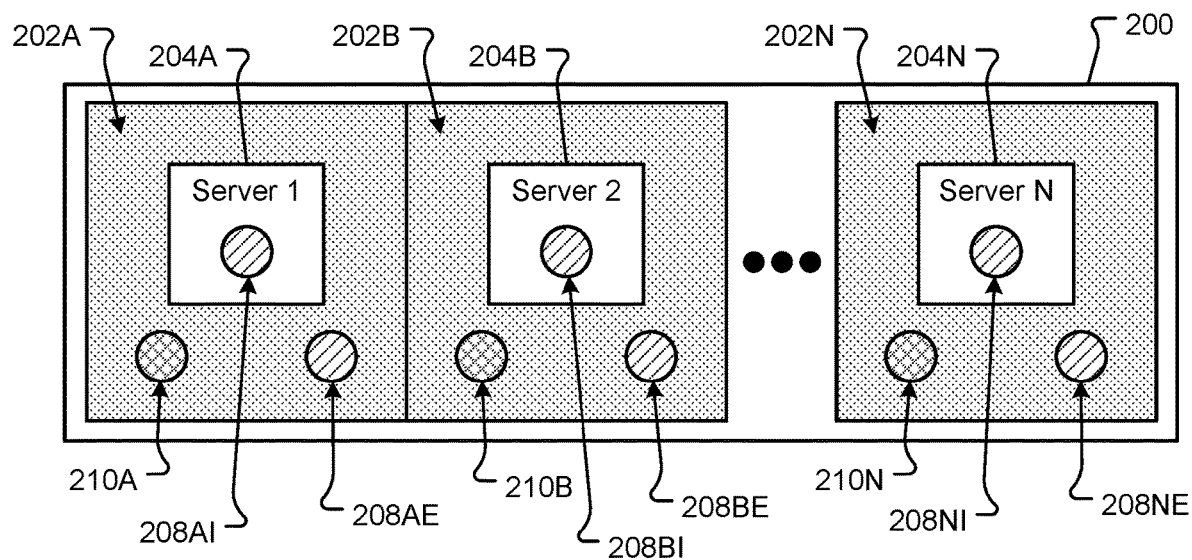
FIG. 2 is a schematic plan view of a server system facility and environmental space in accordance with examples of the present disclosure.

FIG. 2 is a schematic plan view of a server system facility 200 and environmental space in accordance with examples of the present disclosure. The server system facility 200 may correspond to a datacenter or building that houses a plurality of servers 204A-204N. The server system facility 200 may be separated into a plurality of exterior environmental spaces 202A-202N, or zones. Each of the exterior environmental spaces 202A-202N may have one or more servers 204A-204N associated therewith. In addition, each of the exterior environmental spaces 202A-202N may include at least one respective internal particulate sensor 208AI-208NI, external particulate sensor 208AE-208NE, and environmental condition sensor 210A-210N. The internal particulate sensors 208AI-208NI and the external particulate sensors 208AE-208NE may correspond to the particulate sensors 108A-108N described in conjunction with FIG. 1. The environmental condition sensors 210A-210N may correspond to the environmental condition sensors 110A-110N described in conjunction with FIG. 1.

The datacenter, or server system facility 200, may include a number of servers 204A-204N that are arranged in different locations of the building. For instance, the first server 204A is shown as being located in the first exterior environmental space 202A of the server system facility 200. In addition, the first exterior environmental space 202A may include a first internal particulate sensor 208AI that is disposed in, or adjacent, an enclosure of the first server 204A. The enclosure of a server 204A-204N may correspond to a housing of a rack, server, or plurality of servers. A first environmental condition sensor 210A is shown disposed outside of the first server 204A but still disposed inside the first exterior environmental space 202A of the server system facility 200. A first external particulate sensor 208AE is shown as being disposed outside of the enclosure of the first server 204A. A similar arrangement of sensors are shown in the second exterior environmental space 202B. In the second exterior environmental space 202B, a second server 204B is shown including a second internal particulate sensor 208BI associated therewith. The second exterior environmental space 202B shown in FIG. 2 also includes a second environmental condition sensor 210B and a second external particulate sensor 208BE. This arrangement may continue inside the server system facility 200 for one or more other exterior environmental spaces 202A-202N. In some examples, the layout shown in FIG. 2 may correspond to a datacenter having a number of rows (and/or columns) of server systems extending from one end to another end of the server system facility 200.

Each of the internal particulate sensors 208AI-208NI may be configured to detect counts of particulate in air that is associated with an environmental space inside a respective servers 204A-204N over time. In some examples, a contamination event (e.g., a generation of dust, debris, or other particulate) may first be detected at the first server 204A (e.g., by the first internal particulate sensor 208AI detecting the particulate count inside the first server 204A) and as the particulate associated with the contamination event moves throughout the server system facility 200 (e.g., to the right-hand side of the page in FIG. 2), due to air movement created by air handling systems, or other air movement, in the server system facility 200, the second internal particulate sensor 208BI may next detect the contamination event as being at the second server 204B based on the particulate count measured inside the second server 204B. In this manner, the data from each of the internal particulate sensors 208AI-208NI may provide a vector (e.g., direction and speed, etc.) associated with a travel of particulate in a server system facility 200. In response, the control server 116 may determine to take precautionary action and activate the filter system 112 associated with one or more of the exterior environmental spaces 202A-202N in the vector path at one or more times.

In some examples, each of the external particulate sensors 208AE-208NE may be configured to detect counts of particulate in air that is associated with an environmental space outside of, or external to, the respective servers 204A-204N over time. Following the example above, a contamination event (e.g., a generation of dust, debris, or other particulate) may first be detected outside of the first server 204A (e.g., by the first external particulate sensor 208AE detecting the particulate count in the environment outside of the first server 204A). In some examples, the control server 116 may send a signal to the filter system 112 of the first server 204A to actuate the filter into the airflow path upon detecting the contamination event outside of the first server 204A before the contamination event is detected by the first internal particulate sensor 208AI. In an example, the control server 116 may determine to send a signal to the filter system 112 of the first server 204A to actuate the filter into the airflow path only when the contamination event is detected inside the first server 204A (e.g., by the first internal particulate sensor 208AI detecting a particle count above a predetermined particulate limit value, etc.). In any event, the control server 116 may determine to take precautionary action and activate the filter system 112 associated with a server 204A-204N based on particulate amounts detected by the respective external particulate sensors 208AE-208NE disposed outside of the servers 204A-204N.

Similar measurements and actions may be made based on the environmental condition sensors 210A-210N associated with each exterior environmental spaces 202A-202N. For instance, when an extreme temperature (e.g., a temperature above a predetermined value) is detected in the first exterior environmental space 202A by the first environmental condition sensor 210A, the control server 116 may send an alert signal to the communication device 106 across the communication network 104 to notify operational personnel of potential danger. If the control server 116 determines that the temperature measured is indicative of a fire, the control server 116 may send one or more control signals to the servers 204A-204N to filter air, reallocate resources, and/or terminate operations. Among other things, this approach can prevent damage to systems due to ingestion of debris and/or particulate that is above the predetermined particulate limit values.

Figure 3:
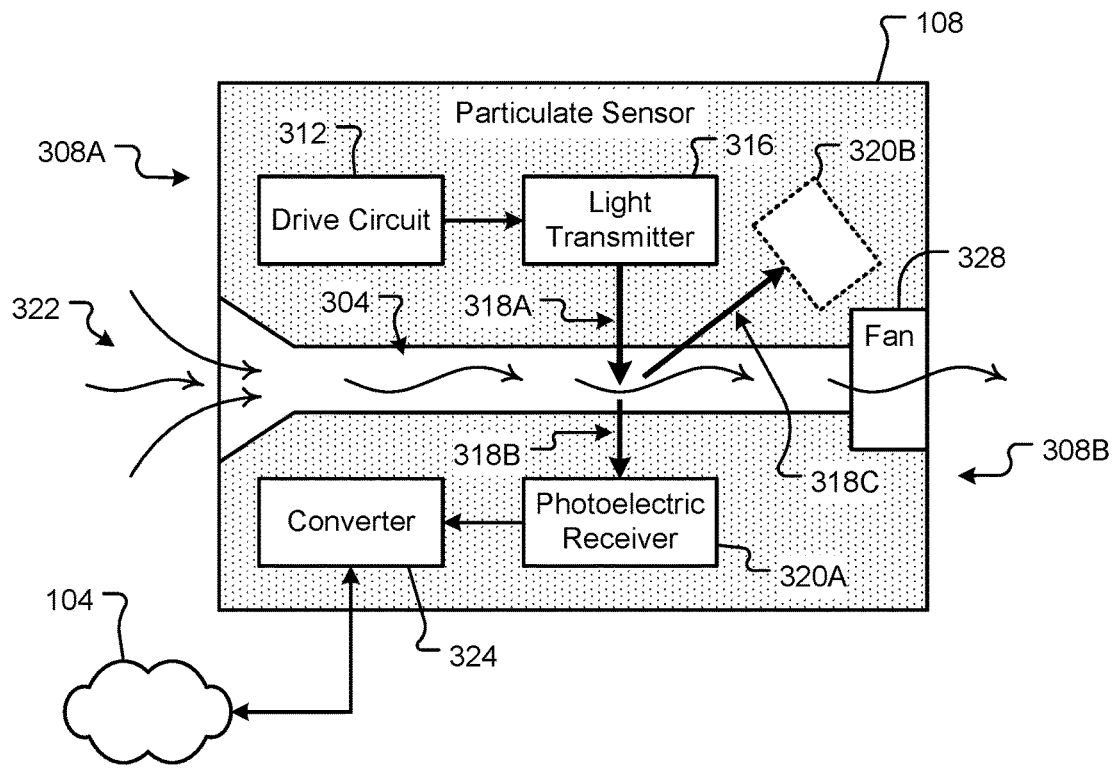
FIG. 3 is a schematic block diagram of a particulate sensor in accordance with examples of the present disclosure.

FIG. 3 is a schematic block diagram of a particulate sensor 108 in accordance with examples of the present disclosure. The particulate sensor 108 illustrated in FIG. 3 may correspond to any one of the particulate sensors 108A-108N described in conjunction with FIG. 1 and/or the particulate sensors 208AI-208NI, 208AE-208NE described in conjunction with FIG. 2. The particulate sensor 108 may include a housing, an airflow passage 304 extending from a first side 308A to a second side 308B, a light transmitter 316, and a photoelectric receiver 320A. In some examples, the air 322 may be caused to flow through the airflow passage 304 by one or more blades of the fan 328 turning and causing the air 322 to be drawn from the first side 308A of the particulate sensor 108 through the airflow passage 304 to the second side 308B of the particulate sensor 108.

As air 322 flows through the airflow passage 304 of the particulate sensor 108, light output 318A emitted by the light transmitter 316 may interact with the air 322 and a portion of the light output 318A emitted by the light transmitter 316 may be detected by the photoelectric receiver 320A. Based on a difference between the amount of the light output 318A and an amount of the portion of the light output 318A that is received by the photoelectric receiver 320A, an amount of particulate in the air 322 may be determined.

In some examples, the light transmitter 316 may correspond to a laser or LED that is driven by the drive circuit 312. The light output 318A may correspond to focused light (e.g., laser light, etc.) that is directed into the airflow passage 304. In an example, the photoelectric receiver 320A may be disposed opposite the light transmitter 316 and the particulate count may be based on an amount of the light received 318B, that passes through the air 322 in the airflow passage 304. In one embodiment, the photoelectric receiver 320A may be configured as an alternative photoelectric receiver 320B that is arranged to detect alternative light received 318C, that is reflected from the air 322 in the airflow passage 304. In any event, a particulate count may be determined by the particulate sensor 108 that reflects a count of particulate in the air that is associated with an environmental space (e.g., around the particulate sensor 108) over time. The data of the particulate count may be converted by a converter 324 before sending across the communication network 104 to the control server 116, etc. The converter 324 may correspond to an analog to digital converter, signal converter, modulator, and/or the like. In some examples, the particulate sensor 108 may correspond to the model PMSA003 digital laser dust sensor manufactured by PlanTower of Beijing, China, or equivalent particulate sensor.

Figure 4:
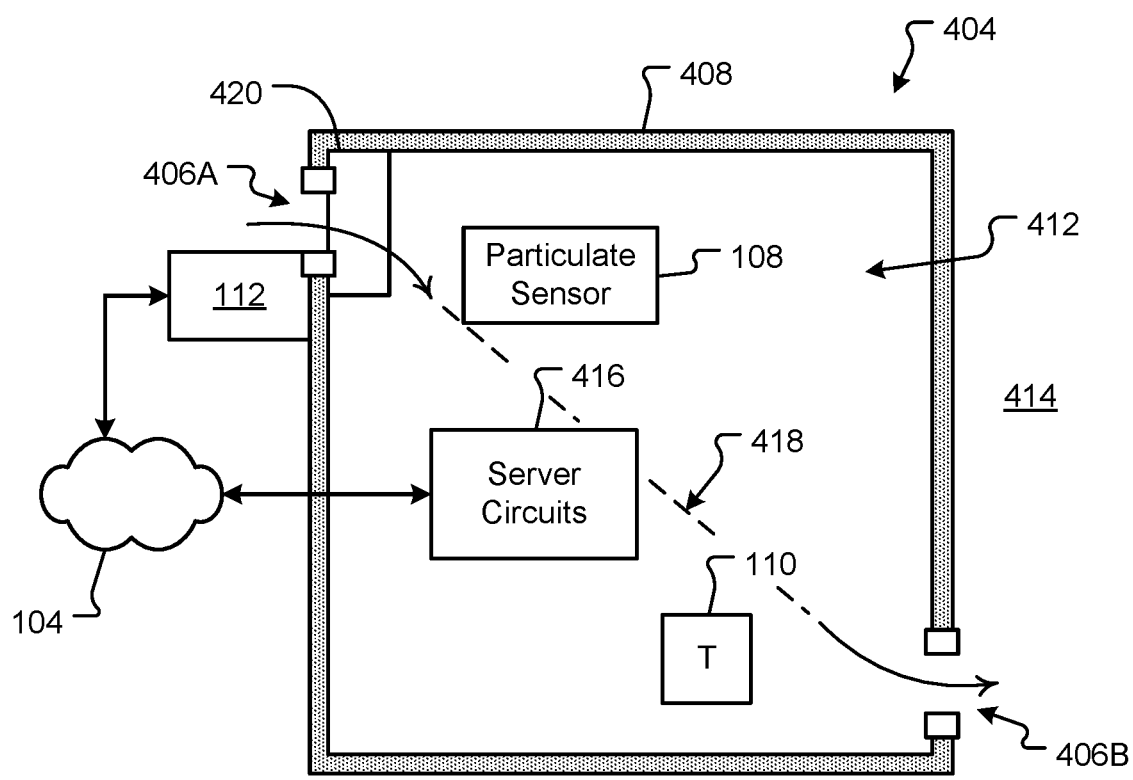
FIG. 4 is a schematic block diagram of a server system in accordance with examples of the present disclosure.

FIG. 4 shows a schematic block diagram of a server system 404 in accordance with examples of the present disclosure. The server system 404 may correspond to any one or more of the servers 204A-204N described above that are arranged in a server system facility 200 and that are part of the particulate mitigation and management system 100. The server system 404 may comprise at least one server including an enclosure 408, or housing. The enclosure 408 separates an interior chamber 412 of the server system 404 from an exterior space 414 of the server system 404. In some examples, the enclosure 408 may be a housing that forms a portion of and/or surrounds a rack, server, or plurality of servers in the server system 404. The interior chamber 412 may define a space that includes at least one of a particulate sensor 108, an environmental condition sensor 110, and one or more server circuits 416 (e.g., ASICs, cooling system, CPUs, FPGAs, graphics processing unit (GPU), memory storage device, power converter, power supply, PCB, switch, etc.). In some examples, an air inlet port 406A may be disposed in a first portion of the enclosure 408 and an air outlet port 406B may be disposed in a second portion of the enclosure 408. The interior chamber 412 may be referred to herein as a controlled space (e.g., environmentally and/or climate controlled space).

The server system 404 may include at least one filter system 112 that is configured to actively control or mitigate particulate entering the interior chamber 412 of the enclosure 408 from the exterior space 414. In some examples, the filter system 112 and/or the one or more server circuits 416 can receive control signals sent by the control server 116, and/or other device in the particulate mitigation and management system 100, across the communication network 104. The filter system 112 may include at least one fan 420 that is arranged adjacent the air inlet port 406A and/or the air outlet port 406B. The fan 420 may be disposed at least partially inside the interior chamber 412 and/or at least partially outside the interior chamber 412. The fan 420 may direct air (e.g., air 322) from the exterior space 414 through the air inlet port 406A along an airflow path 418 to an air outlet port 406B. As illustrated in FIG. 4, the fan 420 is arranged at the air inlet port 406A and is configured to move (e.g., draw in) air from the exterior space 414 through the air inlet port 406A and into the interior chamber 412. The air may follow the airflow path 418 an pass across one or more of the components 108, 110, 416 inside the interior chamber 412 of the enclosure 408. This airflow may cause a continual changeover of air inside the interior chamber 412 and may aid in maintaining a controlled temperature of the one or more server circuits 416. Additional details of the filter system 112 are described in conjunction with FIGS. 5A-5B.

Figure 5A:
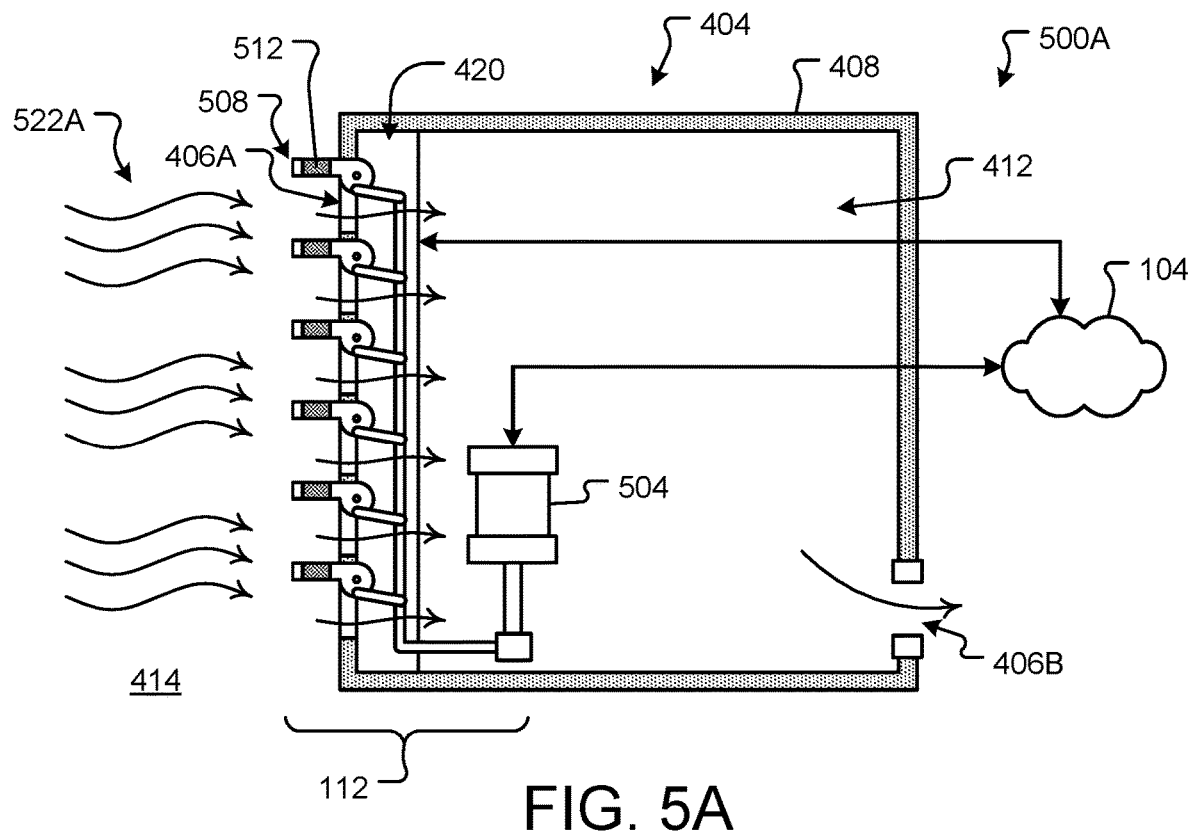
FIG. 5A is a schematic diagram of a server system in an unfiltered operational arrangement in accordance with examples of the present disclosure.
Figure 5B:
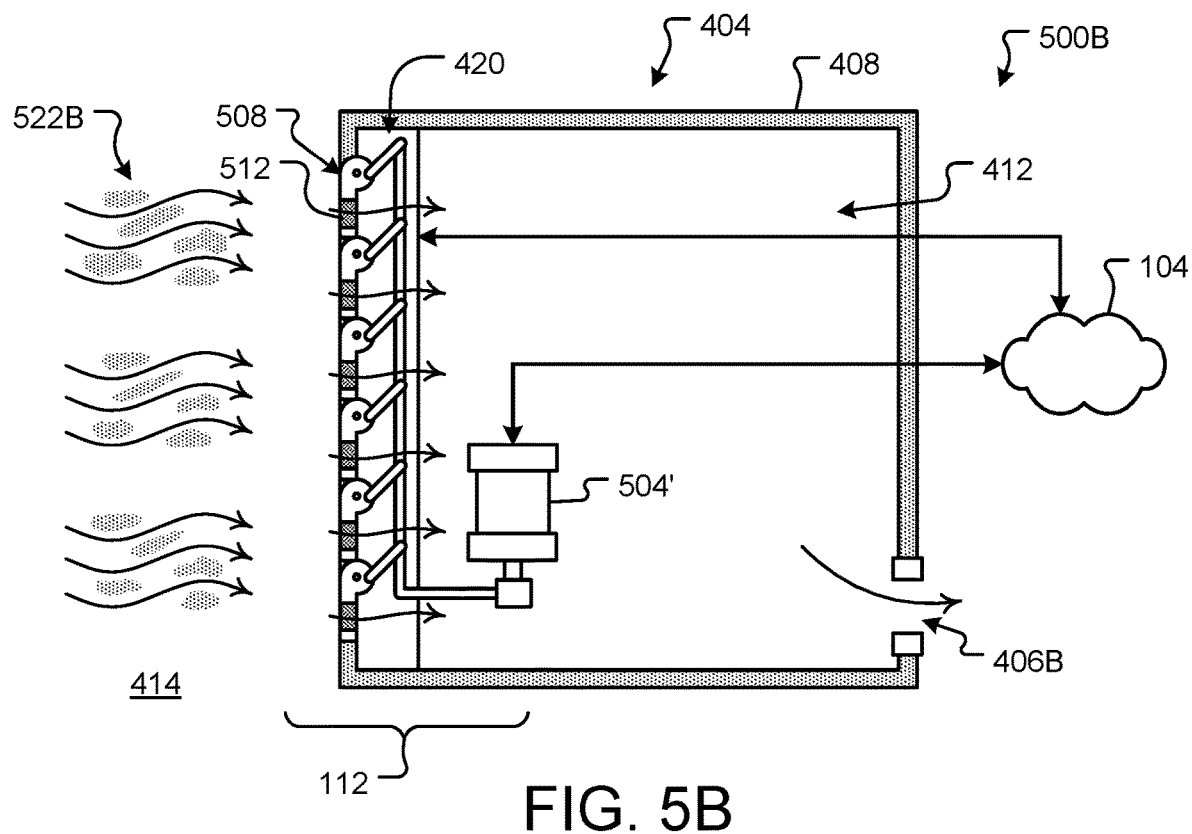
FIG. 5B is a schematic diagram of a server system in filtered operational arrangement in accordance with examples of the present disclosure.

Referring to FIGS. 5A and 5B, schematic diagrams of a server system 404 in different operational arrangements are shown in accordance with examples of the present disclosure. More specifically, FIG. 5A shows a schematic diagram of a server system 404 in an unfiltered operational arrangement 500A and FIG. 5B, shows a schematic diagram of the server system 404 in a filtered operational arrangement 500B. The term "unfiltered operational arrangement," and variations thereof, may be used herein to refer to a state of the server system 404 where air is allowed to enter the interior chamber 412 without passing through one or more filters of the filter system 112. However, it should be appreciated that the air in the exterior space 414 (e.g., outside of the enclosure 408 of the server system 404) may have been previously filtered by an air conditioner (e.g., an air conditioner of the server system facility 200 or room of the server system 404, etc.) before entering the interior chamber 412 in the unfiltered operational arrangement 500A. The terms "unfiltered air," "unfiltered flow path," and/or variations thereof may be used to refer to air that is allowed to enter the interior chamber 412 of the enclosure 408 without having to pass through the one or more filters of the filter system 112, regardless of whether the air in the exterior space 414 has been previously filtered (e.g., by an air conditioner of the server system facility 200, etc.) or not. The term "filtered operational arrangement," and variations thereof, may be used herein to refer to a state of the server system 404 where air entering the interior chamber 412 of the enclosure 408 is caused to pass through one or more filters of the filter system 112 as described herein. Similarly, the terms "filtered air," "filtered flow path," and/or variations thereof may be used to refer to air that is caused to pass through the one or more filters of the filter system 112.

The server system 404 described in conjunction with FIGS. 5A and 5B may be the same as the server system 404 described in conjunction with FIG. 4. In FIG. 4, details of the filter system 112 are not shown for sake of clarity in disclosure, while several of the components (e.g., particulate sensor 108, environmental condition sensor 110, server circuits 416, etc.) shown in FIG. 4 are not shown in FIGS. 5A-5B for the sake of clarity in disclosure. However, it should be appreciated that the server system 404 shown in FIGS. 4, 5A, and 5B may include any of the components shown and described in conjunction with FIGS. 1-5B.

The filter system 112 may comprise at least one fan 420, actuator 504, and filter 508. The actuator 504 may correspond to one or more pneumatic or hydraulic cylinders, linear actuators, motors, rotary actuators, screw actuators, solenoids, or other mechanism that is capable of moving between a first position and a second position. In some examples, the actuator 504 may be configured to move to positions between the first position and second position. The filter 508 may include at least one porous filtration substrate portion 512. The porous filtration substrate 512 may correspond to a HEPA filter or other filter substrate that is configured to filter particles of a predetermined size from the air as the air passes through the porous filtration substrate 512. In some examples, the HEPA filter substrate may have an average particle filtration size between 0.3 microns and 5.0 microns.

As illustrated in FIGS. 5A and 5B, the filter system 112 may comprise an array of filters 508 that are operatively connected to the actuator 504. Although shown in a moveable louver configuration, it should be appreciated that the filters 508 may be selectively arranged into and out of the airflow path 418 (illustrated in FIG. 4).

In FIG. 5A, the actuator 504 is shown in a filter-open position. In the filter-open position, the clean air 522A in the exterior space 414 outside of the enclosure 408 is allowed to enter the air inlet port 406A without passing through the porous filtration substrate 512 of the filter 508. Stated another way, in the filter-open position of the actuator 504, the at least one porous filtration substrate portion 512 is arranged outside of the airflow path providing an unfiltered flow path between the exterior space 414 and the interior chamber 412. The filter system 112 is controlled (e.g., via the control server 116, etc.) to operate in the unfiltered operational arrangement 500A when the amount of particulate detected in the air by at least one particulate sensor 108 is determined to be within acceptable particulate limit values (e.g., below a predetermined particulate limit value). When the amount of particulate detected in the air is determined to be within acceptable particulate limit values, the air may be referred to herein as clean air 522A.

In some examples, the actuator 504 may be caused to actuate from the filter-open position to the filter-closed position shown in FIG. 5B. The actuator 504 may receive a control signal from the control server 116 across the communication network 104 when the control server 116 determines that the amount of particulate detected in the air by at least one particulate sensor 108 is determined to be outside of acceptable particulate limit values (e.g., above, or exceeding, a predetermined particulate limit value). When the amount of particulate detected in the air is determined to be outside of, or exceed, acceptable particulate limit values, the air may be referred to herein as dirty air 522B. In the filter-closed position shown in FIG. 5B, the dirty air 522B in the exterior space 414 outside of the enclosure 408 is caused to pass through each of the porous filtration substrates 512 before entering the interior chamber 412 of the enclosure 408. Stated another way, in the filter-closed position of the actuator 504, the at least one porous filtration substrate portion 512 is arranged in the airflow path providing a filtered flow path between the exterior space 414 and the interior chamber 412. In some examples, when the server system 404 is in the filtered operational arrangement 500B, the fan 420 may be caused to increase a speed from a first speed to a higher second speed. The first speed may correspond to a "standard" speed of the fan 420 when the server system 404 is in the unfiltered operational arrangement 500A of FIG. 5A. At least one benefit of operating the fan 420 at a higher speed may include maintaining a predetermined number of air changes per hour for the server system 404 when airflow is partially restricted by the filter 508 in the filtered operational arrangement 500B.

Figure 6:
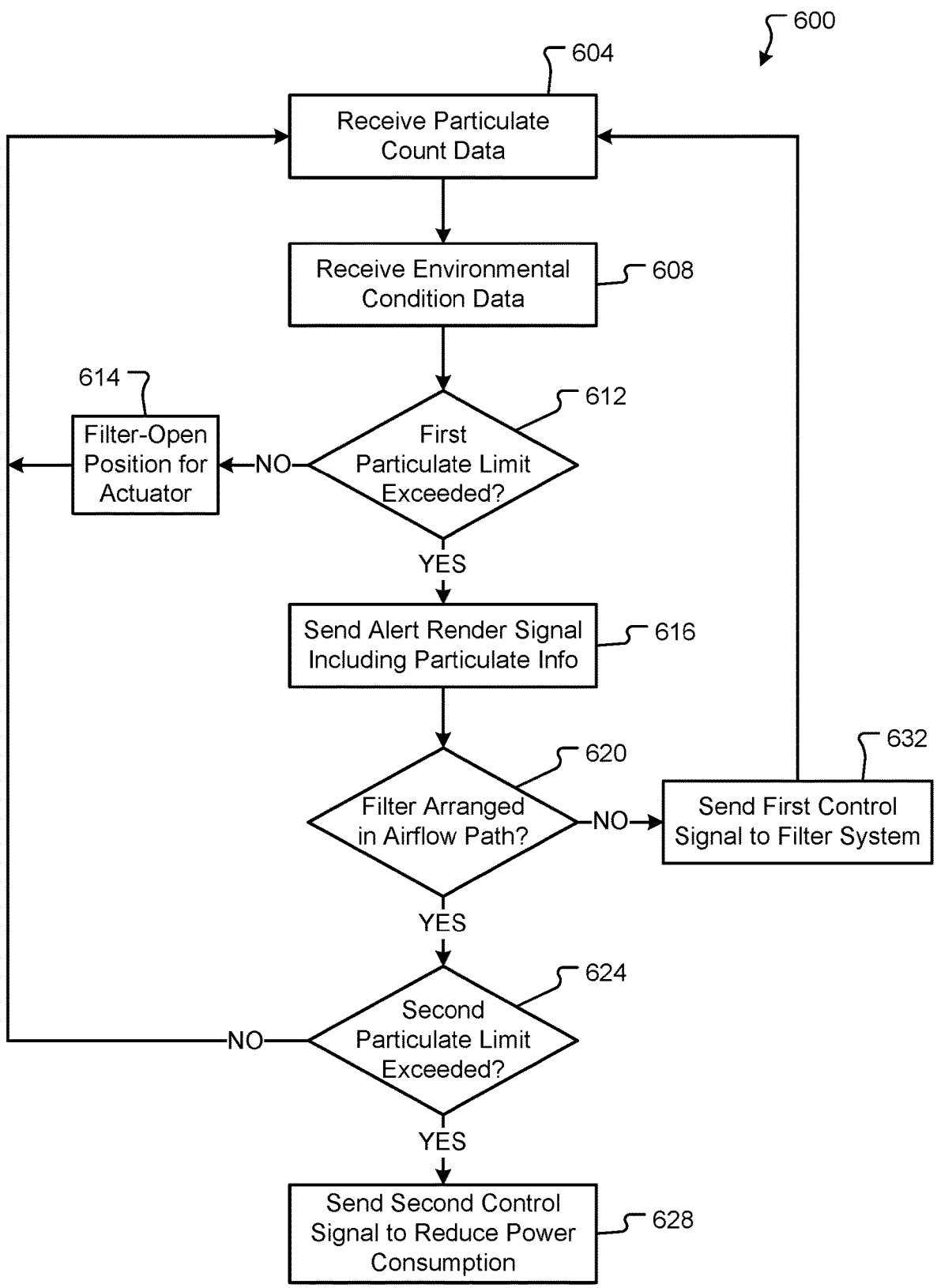
FIG. 6 is a flow diagram of a method for mitigating a contamination of a controlled space in accordance with examples of the present disclosure.

FIG. 6 is a flow diagram 600 of a method for mitigating a contamination of a controlled space (e.g., the interior chamber 412 of a server system 404, etc.) in accordance with examples of the present disclosure. The flow diagram 600 may include different steps or operations for performing the method for mitigating the contamination of a controlled space as described herein. The steps and operations of the flow diagram 600 may be carried out or otherwise performed, for example, by at least one processor. The at least one processor may be the same as or similar to the processor(s) described above. The at least one processor may be part of a computing device (such as a personal computer, a laptop, a smartphone, server, etc.). For example, the steps and operations of the flow diagram 600 may be carried out or otherwise performed by an application, the control server 116, the analysis server 118, and/or the like, as described herein.

The method may begin as step 604 by receiving particulate count data from one or more particulate sensors 108 in a particulate mitigation and management system 100. The particulate sensors 108 may correspond to any one or more of the particulate sensors 108, 108A-108N, 208AI-208NI, and 208AE-NE described in conjunction with FIGS. 1-4. In some examples, the data received may correspond to, or include, counts of particulate in air that is associated with an environmental space over time. The environmental space may correspond to a space inside the interior chamber 412 of the server system 404 and/or the exterior space 414 outside of the server system 404. In some examples, the one or more particulate sensors 108 may send the data across the communication network 104 to be received by the control server 116. The data may include an identification of each particulate sensor 108 sending the data, a location for each particulate sensor 108 sending the data, and/or other information associated with the particulate sensor 108.

Next, the method may continue by receiving environmental condition data from one or more environmental condition sensors 110 in the particulate mitigation and management system 100 (step 608). The environmental condition sensors 110 may correspond to any one or more of the environmental condition sensors 110, 110A-110N, and 210A-210N described in conjunction with FIGS. 1-4. The data received may correspond to, or include, at least one temperature, pressure, and humidity level value associated with an environmental space over time. The environmental space may correspond to a space inside the interior chamber 412 of the server system 404 and/or the exterior space 414 outside of the server system 404. In some examples, the one or more environmental condition sensors 110 may send the data across the communication network 104 to be received by the control server 116. The data may include an identification of each environmental condition sensor 110 sending the data, a location for each environmental condition sensor 110 sending the data, and/or other information associated with the environmental condition sensor 110.

The method may determine, based at least partially on the particulate data received, that an amount of particulate in the air exceeds at least one predetermined particulate limit value (step 612). The predetermined particulate limit value may correspond to the values and limits stored in the predetermined limits 140 of the control server 116 memory 128. In some examples, a number of predetermined particulate limit values may be stored in the predetermined limits 140. For instance, at a first predetermined particulate limit value, the amount of particulate in the air may be filtered to prevent contamination of the controlled space (e.g., interior chamber 412 of the enclosure 408, etc.). Continuing this example, at a second predetermined particulate limit value (e.g., that is higher than the first particulate limit value), the amount of particulate in the air may be too high to be effectively filtered without causing contamination of the controlled space. In this tiered response scheme, different particulate measurements over time may cause different controls of the server system 404. When the amount of particulate in the air is determined to be within (e.g., not exceed) a first predetermined particulate limit value, the method may ensure the actuator 504 is in the filter-open position (step 614) and return to step 604. However, when the amount of particulate in the air is determined to be exceed the first predetermined particulate limit value, the method may continue to step 616.

In some cases, the method may proceed by sending an alert signal to at least one device in the particulate mitigation and management system 100 (step 616). In some examples, the alert signal may cause a communication device 106 to render information about particulate measurements when the amount of particulate in the air exceeds the first predetermined particulate limit value. The information rendered by the communication device 106 may include at least one of an alarm, information about the detected particulate count, instructions to mitigate or control contamination, and/or other information that may assist an operator, or other personnel, to discover or otherwise be made aware of a contamination event that has occurred or will occur. In some examples, the information rendered by the communication device 106 may include a map of the server system facility 200 and an identification of the location where the particulate count was detected to be above the first predetermined particulate limit value.

The method may continue by determining whether at least one filter is arranged in an airflow path of a server enclosure 408 that is near, in, at, or around the location where the particulate count was detected to be above the first predetermined particulate limit value (step 620). In some examples, this determination may be made based on a signal provided by the actuator 504 of the filter system 112. For instance, a sensor disposed on the actuator 504 may identify whether the actuator 504 is in a filter-open or a filter-closed position. This signal may be received by the control server 116 in communication with the actuator 504 or filter system 112 over the communication network 104. When the filter is determined to be in the filter-open position (e.g., not in the airflow path), the method may continue by sending a first control signal to the filter system 112 (step 632). The first control signal may cause the actuator 504 to move from a filter-open position into a filter-close position disposing the porous filtration substrate 512 in the airflow path for the server system 404. This condition is illustrated in FIG. 5B showing the filtered operational arrangement 500B of the server system 404. The method may return to step 604 and continue to receive particulate count data over time. In some examples, upon executing the method again, the particulate count data received may indicate that the amount of particulate in air that is associated with an environmental space over time has decreased and is within acceptable limits (e.g., below the first predetermined particulate limit value). In this example, the method may proceed to step 614 and send a control signal to the filter system 112 that causes the actuator 504 to move into the filter-open position.

In some examples, the method may determine that the filter 508 and, more specifically, the porous filtration substrate 512 is already arranged in the airflow path (e.g., the actuator 504 is in the filter-closed position) and the server system 404 is in the filtered operational arrangement 500B. Continuing this example, the method may determine whether a second predetermined particulate limit value has been exceeded. The second predetermined particulate limit value may correspond to an amount of particulate in the air that, even with the porous filtration substrate 512 in the airflow path may cause contamination, poor performance, or failure of the server system 404. In these cases, the count of particulate may cause the porous filtration substrate 512 to clog or cause a buildup of particulate on the porous filtration substrate 512 over time that may prevent the at least one fan 420 from changing the air inside the interior chamber 412 efficiently (e.g., at a predetermined power level or number of Watts). In some examples, the particulate count and/or other data may indicate a fire or smoke is flowing throughout the server system facility 200, in this case, reallocating processing resources to another server system 404 or server system facility 200 may be beneficial to prevent damage to the server system 404 where the fire or smoke is located and/or to prevent interruptions to processing jobs performed by server systems 404 in the server system facility 200. When the second predetermined particulate limit value has been exceeded, as determined in step 624, the method may proceed to step 628. In the event that second predetermined particulate limit value has not been exceeded, the method may return to step 604 for further processing.

In step 628, the method may proceed by sending a second control signal (e.g., a power consumption adjustment signal, etc.) to at least one server system 404 in the server system facility 200 to reduce a power consumption. Reducing a power consumption of the server system 404 may include, but is in no way limited to, sending a signal that reduces a load on the server system 404, causes the one or more server circuits 416 to reduce a clock speed (e.g., processor speed, GPU speed, etc.) from a first value to a lower second value, and/or partially or completely terminate operations of the server system 404. In some examples, the second control signal may include sending a process initiation signal to another server system 404 in the server system facility 200 or to another server system 404 that is remotely located from the server system facility 200. The method may end or continually repeat from step 604.

Figure 7:
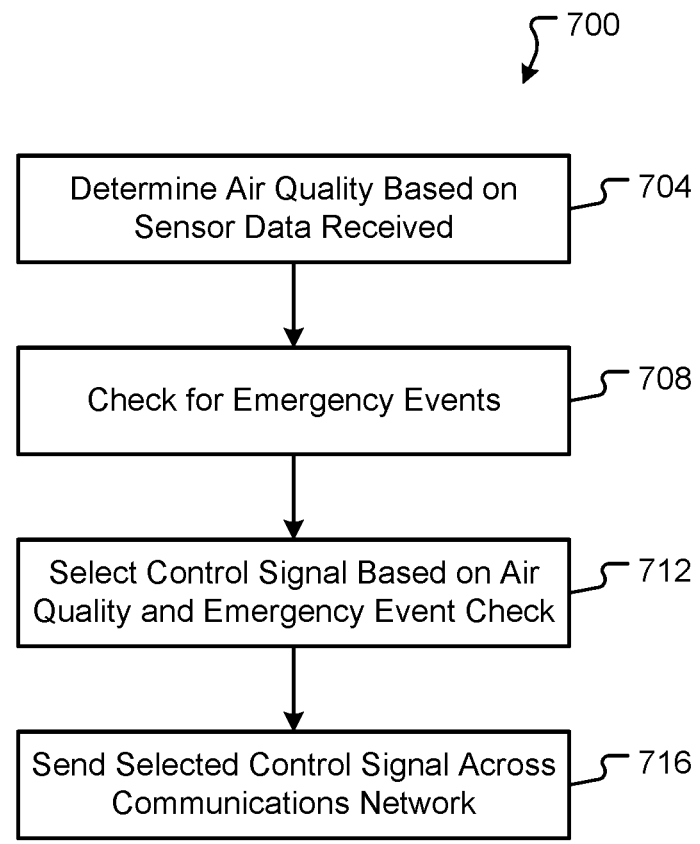
FIG. 7 is a flow diagram of a method for sending control signals based on determined air quality of an environment in accordance with examples of the present disclosure.

FIG. 7 is a flow diagram 700 of a method for sending control signals based on determined air quality of an environment (e.g., the interior chamber 412 of a server system 404, the exterior environmental spaces 202A-202N of a server system facility 200, etc.) in accordance with examples of the present disclosure. The flow diagram 700 may include different steps or operations for performing the method of sending control signals as described herein. The steps and operations of the flow diagram 700 may be carried out or otherwise performed, for example, by at least one processor. The at least one processor may be the same as or similar to the processor(s) described above. The at least one processor may be part of a computing device (such as a personal computer, a laptop, a smartphone, server, etc.). For example, the steps and operations of the flow diagram 700 may be carried out or otherwise performed by an application, the control server 116, the analysis server 118, and/or the like, as described herein.

The method of the flow diagram 700 may begin by determining an air quality based on sensor data received (step 704). In some examples, step 612 of FIG. 6 may correspond to one or more steps performed in the method of flow diagram 700, or vice versa. In any event, the air quality may correspond to a level or amount of particulate in air that is associated with one or more spaces in the server system facility 200. In some examples, the air quality may be localized to one or more server systems 404. In any event, the control server 116 may receive particulate counts from particulate sensors 108 disposed at one or more spaces in a server system facility 200 and, based on the information stored in the predetermined limits 140 of the memory 128, determine an air quality. The air quality may be a number including a parts per million, or mg/L, of particulate measured in the air at one or more times. The air quality may be classified as "clean" when the amount of particulate measured in the air is less than a predetermined particulate limit value. Additionally or alternatively, the air quality may be classified as "dirty" or "contaminated" when the amount of particulate measured in the air is greater than the predetermined particulate limit value.

In some examples, the air quality may indicate that an emergency event is present near a server system facility 200 and/or near one or more server systems 404 in a server system facility 200. When the air quality includes a specific particulate content/type and/or temperature, the method may proceed by determining whether an emergency event is associated with the specific particulate content and/or temperature (step 708). By way of example, if the particulate is of the smoke content/type, and/or the temperature of the air is higher than a predetermined temperature value, the method may determine a fire emergency event exists. However, when the particulate count falls below a predetermined particulate limit value (e.g., in parts per million, mg/L, etc.), the method may determine that no emergency event exists.

Based on the air quality and emergency event check, the method may proceed by selecting a corresponding control signal to send in the particulate mitigation and management system 100 (step 712). These control signals may include, but are in no way limited to, signals that cause the particulate mitigation and management system 100 to automatically move at least one porous filter substrate 512 into an airflow path between the controlled space (e.g., inside the interior chamber 412 of the enclosure 408) and an exterior space 414 outside of the interior chamber 412 and enclosure 408 (e.g., when the amount of particulate in the air exceeds a specific predetermined particulate limit value), move at least one porous filter substrate 512 out of an airflow path between the controlled space and the exterior space 414 outside of the interior chamber 412 and enclosure 408 (e.g., when the amount of particulate in the air is below the specific predetermined particulate limit value), adjust a power consumption of the server system 404, cause an alert to be rendered by a display device of one or more devices in a particulate mitigation and management system 100, etc., and/or combinations thereof. Each control signal may be specific to a type or tier of particulate measured, air quality determined, and/or combinations thereof.

Once the corresponding control signal is selected, the method may proceed by sending the selected control signal across the communication network 104 to one or more devices in the particulate mitigation and management system 100 (step 716). In some examples, the selected control signal is sent from the control server 116 to at least one of the communication device 106, the filter system 112, the server system 404, the actuator 504, and/or other components, servers, and devices connected to the particulate mitigation and management system 100 via the communication network 104. The method of the flow diagram 700 may repeat periodically, continually, or at predetermined intervals.

Figure 8:
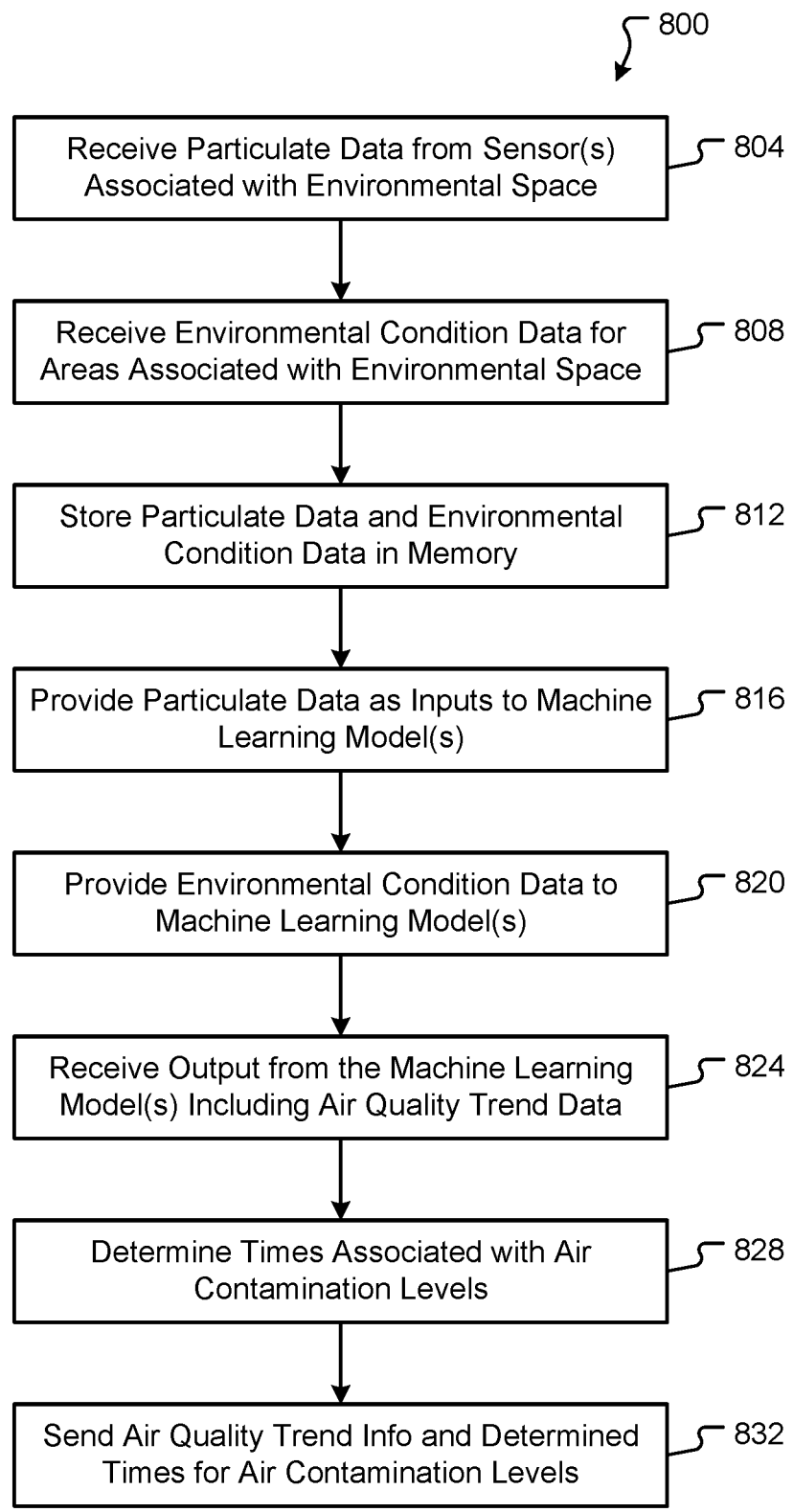
FIG. 8 is a flow diagram of a method for determining air quality trends based on machine learning models in accordance with examples of the present disclosure.

FIG. 8 is a flow diagram 800 of a method for determining air quality trends based on machine learning models in accordance with examples of the present disclosure. In some examples, the method describe in flow diagram 800 may be performed by the analysis server 118, the control server 116, and/or a combination thereof. As described in conjunction with FIG. 1, the analysis server 118 may access data stored in the database 114 and/or the control server 116 in performing the method of flow diagram 800.

The method may begin by one or more particulate sensors 108 collecting particulate data in one or more environmental spaces (e.g., interior chambers 412, exterior environmental spaces 202A-202N, server system facilities 200, and/or the like). The particulate data may be received by one or more of the database 114, the control server 116, and the analysis server 118 (step 804). In some examples, step 804 may correspond to step 604 described in conjunction with FIG. 6.

Next, the method may receive environmental condition data from one or more environmental condition sensors 110 for areas associated with one or more environmental spaces (e.g., interior chambers 412, exterior environmental spaces 202A-202N, server system facilities 200, and/or the like). The environmental data may be received by one or more of the database 114, the control server 116, and the analysis server 118 (step 808). In some examples, step 808 may correspond to step 608 described in conjunction with FIG. 6.

The method may store the particulate data and the environmental data in memory (step 812). This memory may correspond to at least one memory storage device and may include the database 114 and/or the memory 128.

The particulate data may be provided as inputs to a machine learning model (e.g., the machine learning model 148 of the analysis server 118) (step 816). These inputs may define historical particulate counts for the one or more environmental spaces over time. In addition, the inputs may define an identification of the particulate sensor 108 associated with the collected data, a location of the particulate sensor 108 associated with the collected data, and/or the like.

In some examples, the environmental data may be provided as inputs to a machine learning model (e.g., the machine learning model 148 of the analysis server 118) (step 820). These inputs may define historical temperature measurements for the one or more environmental spaces over time. Additionally, the inputs may define an identification of the environmental condition sensor 110 associated with the collected data, a location of the environmental condition sensor 110 associated with the collected data, and/or the like.

Next, the method may proceed by receiving an output from the machine learning model 148 (step 824). The output may include air quality trend data for the one or more environmental spaces over time. Stated another way, the output received from the machine learning model 148 may be generated based on the machine learning model 148 processing the data inputs and may include an air quality trend for the environmental space over time. In some examples, the air quality trend may provide historical or near-real-time trends for the air quality in an environmental space. In an example implementation, the air quality trend may predict, based on current and historical particulate counts, a future expected particulate count for the environmental spaces.

Based on the air quality trend, the method may proceed by determining, times associated with at least one contamination level for the environmental space (step 828). The air quality trend may include information that describes the historical air quality of the environmental space over time. This information may be presented as part of a chart, graph, or table. In some examples, the times associated with air contamination levels may be at a time that has not yet occurred, or is at some time in the future. As can be appreciated an air quality trend that includes predicted times associated with at least one contamination level that is expected to occur may be used by the control server 116 in initiating a control signal prior to the contamination occurring. In this manner, the filter system 112 may be activated (e.g., moving the porous filtration substrate 512 into the airflow path of one or more server systems 404, etc.) ahead of a contamination event occurring. For instance, the control server 116 may send a communication signal to the particulate management system 100 comprising at least one of an alert signal (e.g., including information about current and/or expected (future) contamination levels, etc.), a control signal (e.g., causing the actuator 504 to move, etc.), and a power consumption adjustment signal (e.g., adjusting clock speed, fan speed, load, and/or terminating operations of one or more servers of the server system 404, etc.) in advance of an expected contamination event.

The method may send the air quality trend information including the determined times for the air contamination levels (e.g., variations in air quality that are above a predetermined particulate limit value, etc.) to one or more devices in the particulate mitigation and management system 100 (step 832). For example, the air quality trend information may be sent from the analysis server 118 to the control server 116. In some examples, the control server 116 may determine, based on the air contamination levels in the air quality trend, to send a control signal to a filter system 112, server system 404, and/or other device in the particulate mitigation and management system 100. In one example, the control server 116 may send an alert signal to the communication device 106 causing the communication device 106 to render information about the air quality trend via a display device, application, and/or dashboard. In some cases, the information rendered by the communication device 106 may provide instructions for an operator to take action regarding a potential contamination event, investigate the source of the contamination event, and/or isolate or reallocate resources used in processing data hosted by the server systems 404 in the server system facility 200.

Any of the steps, functions, and operations discussed herein can be performed continuously and automatically.

While the flowcharts have been discussed and illustrated in relation to a particular sequence of events, it should be appreciated that changes, additions, and omissions to this sequence can occur without materially affecting the operation of the disclosed embodiments, configuration, and aspects.

The exemplary systems and methods of this disclosure have been described in relation to datacenters, servers, and server systems. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in conjunction with one embodiment, it is submitted that the description of such feature, structure, or characteristic may apply to any other embodiment unless so stated and/or except as will be readily apparent to one skilled in the art from the description. The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

As used herein, the singular forms "a," "an," and "the" are intended to include the plural forms as well, unless the context clearly indicates otherwise. It will be further understood that the terms "include," "including," "includes," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

It should be understood that every maximum numerical limitation given throughout this disclosure is deemed to include each and every lower numerical limitation as an alternative, as if such lower numerical limitations were expressly written herein. Every minimum numerical limitation given throughout this disclosure is deemed to include each and every higher numerical limitation as an alternative, as if such higher numerical limitations were expressly written herein. Every numerical range given throughout this disclosure is deemed to include each and every narrower numerical range that falls within such broader numerical range, as if such narrower numerical ranges were all expressly written herein.

What is claimed is:

1. A particulate mitigation and management system, comprising:
   a particulate sensor configured to detect an amount of particulate in air that is associated with an environmental space over time;
   an enclosure comprising an interior chamber and an airflow port disposed through at least one side of the enclosure and defining an airflow path extending from an exterior space outside of the enclosure to the interior chamber of the enclosure, wherein the enclosure is a server rack, wherein the interior chamber comprises one or more circuits, and wherein the exterior space corresponds to a space in a server facility that houses the server rack;
   an actuator configured to move between a first position and a second position; and
   a filter operatively connected to the actuator, the filter comprising at least one porous filtration substrate portion, wherein, in the first position, the at least one porous filtration substrate portion is arranged in the airflow path providing a filtered flow path between the exterior space and the interior chamber, wherein, in the second position, the at least one porous filtration substrate portion is arranged outside of the airflow path providing an unfiltered flow path between the exterior space and the interior chamber.

2. The system of claim 1, further comprising:
   a fan operatively coupled with the enclosure and configured to move air between the exterior space outside of the enclosure and the interior chamber of the enclosure via the airflow port when the actuator is in the first position and when the actuator is in the second position.

3. The system of claim 2, further comprising:
   a processor; and
   a memory coupled with and readable by the processor and storing therein instructions that, when executed by the processor, cause the processor to:
     receive a first particulate count corresponding to an amount of particulate in the air detected by the particulate sensor at a first time;
     determine, based on the first particulate count received, that the amount of particulate in the air at the first time is greater than a predetermined unfiltered particulate limit value; and
     send, automatically across a communication network, a first control signal to the actuator that causes the actuator to move into the first position.

4. The system of claim 3, wherein the instructions, when executed by the processor, further cause the processor to:
receive a second particulate count corresponding to an amount of particulate in the air detected by the particulate sensor at a second time that is subsequent to the first time;
determine, based on the second particulate count received, that the amount of particulate in the air at the second time is greater than a predetermined filterable particulate limit value; and
send, automatically across a communication network, a second control signal that adjusts a power consumption of one or more circuits operating inside the enclosure.

5. The system of claim 3, wherein the instructions, when executed by the processor, further cause the processor to:
receive a second particulate count corresponding to an amount of particulate in the air detected by the particulate sensor at a second time;
determine, based on the second particulate count received, that the amount of particulate in the air at the second time is less than the predetermined unfiltered particulate limit value; and
send, automatically across a communication network, a second control signal to the actuator that causes the actuator to move from the first position into the second position.

6. The system of claim 5, wherein the instructions, when executed by the processor, further cause the processor to:
send, automatically across the communication network when the actuator is in the first position, a first speed control signal to the fan that sets a speed of the fan at a first speed; and
send, automatically across the communication network when the actuator is in the second position, a second speed control signal to the fan that sets the speed of the fan at a second speed, wherein the second speed is lower than the first speed.

7. The system of claim 6, wherein the particulate sensor comprises:
an interior particulate sensor disposed inside the interior chamber; and
an exterior particulate sensor disposed in the exterior space.

8. The system of claim 7, wherein the particulate sensor comprises:
a light transmitter;
a photoelectric receiver; and
one or more circuits configured to cause the light transmitter to output light toward the air in the environmental space and to cause the photoelectric receiver to receive at least a portion of the light output by the light transmitter and, based on a difference in an amount of the light output and an amount of the at least the portion of the light received, determine the amount of particulate in air in the environmental space at a time the one or more circuits cause the light transmitter to output light.

9. The system of claim 7, wherein, prior to determining that the amount of particulate in the air at the first time is greater than a predetermined unfiltered particulate limit value, the instructions, when executed by the processor, further cause the processor to:
determine an amount of particulate in the air detected by the interior particulate sensor at the first time;
determine an amount of particulate in the air detected by the exterior particulate sensor at the first time; and
determine, based on a comparison of the amount of particulate in the air detected by the interior particulate sensor at the first time and the amount of particulate in the air detected by the exterior particulate sensor at the first time, that a contamination is in the exterior space and is not in the interior chamber.

10. A method of mitigating a contamination of a controlled space, comprising:
receiving, from a particulate sensor, data corresponding to counts of particulate in air that is associated with an environmental space over time;
determining, by a processor based on the data received, that an amount of particulate in the air exceeds at least one predetermined particulate limit value;
sending, by the processor, an alert signal that causes a communication device to render information about particulate measurements when the amount of particulate in the air exceeds a first predetermined particulate limit value; and
sending, by the processor, a control signal that causes a particulate management system to automatically move an actuator from a filter-open position to a filter-closed position when the amount of particulate in the air exceeds a second predetermined particulate limit value, wherein a filter comprising at least one porous filter substrate is operatively connected to the actuator, wherein, in the filter-closed position, the at least one porous filter substrate is arranged in into an airflow path providing a filtered flow path between the controlled space and an exterior space outside of the controlled space when the amount of particulate in the air exceeds a second predetermined particulate limit value, wherein, in the filter-open position, the at least one porous filter substrate is arranged outside of the airflow path providing an unfiltered flow path between the controlled space and the exterior space, wherein the second predetermined particulate limit value comprises a greater particulate count than the first predetermined particulate limit value, wherein the controlled space corresponds to an interior chamber of a server, wherein the interior chamber comprises one or more circuits, and wherein the exterior space corresponds to a space in a server facility that houses the server.

11. The method of claim 10, wherein the data is collected by at least one of an interior particulate sensor disposed inside the interior chamber and an exterior particulate sensor disposed in the exterior space.

12. The method of claim 11, further comprising;
sending, by the processor, a power consumption adjustment signal that causes the particulate management system to adjust a power consumption of the one or more circuits operating inside the interior chamber when the amount of particulate in the air exceeds a third predetermined particulate limit value, wherein the third predetermined particulate limit value comprises a greater particulate count than the second predetermined particulate limit value.

13. The method of claim 12, further comprising:
providing the data as inputs to a machine learning model, wherein the inputs define historical particulate counts for the environmental space over time;
receiving an output from the machine learning model, wherein the output received from the machine learning model is generated based on the machine learning model processing the inputs and includes an air quality trend for the environmental space;

determining, based on the air quality trend, times associated with at least one contamination level for the environmental space; and sending, based on the times associated with the at least one contamination level, a communication signal to the particulate management system comprising at least one of the alert signal, the control signal, and the power consumption adjustment signal, wherein the communication signal is automatically selected based on the at least one contamination level.

14. The method of claim 13, wherein the communication signal is sent to the particulate management system prior to the times determined.

15. The method of claim 14, wherein the times associated with the at least one contamination level comprise a first time associated with a low contamination level having a first particulate count for the environmental space, a second time associated with a medium contamination level having a second particulate count that is higher than the first particulate count, and a third time associated with a high contamination level having a third particulate count that is higher than the second particulate count.

16. The method of claim 15, wherein the alert signal is sent to the particulate management system prior to the first time for the low contamination level, wherein the control signal is sent to the particulate management system prior to the second time for the medium contamination level, and wherein the power consumption adjustment signal is sent to the particulate management system prior to the third time for the high contamination level.

17. The method of claim 10, wherein the data is received in real time as the data is collected by one or more particulate sensors, and wherein the method further comprises:

storing the data along with a timestamp and identification of each sensor of the one or more particulate sensors, wherein the identification of each sensor identifies a location of each sensor in the environmental space.

18. A server, comprising:
at least one fan;
an enclosure, comprising:
an interior chamber disposed inside the enclosure;
an air inlet disposed in a first portion of the enclosure, the air inlet defining an inlet port extending from an exterior space outside of the enclosure into the interior chamber; and
an air outlet disposed in a second portion of the enclosure, the air outlet defining an outlet port extending from the interior chamber to the exterior space outside of the enclosure, wherein the at least one fan causes air to flow from the exterior space through the enclosure along an airflow path running from the air inlet to the air outlet, wherein the enclosure is a server rack, wherein the interior chamber comprises one or more circuits, and wherein the exterior space corresponds to a space in a server facility that houses the server rack;
a particulate sensor disposed at least partially inside the interior chamber, the particulate sensor configured to detect an amount of particulate in the air flowing through the enclosure over time;
an actuator configured to move between a first position and a second position; and
a filter operatively connected to the actuator, the filter comprising at least one porous filtration substrate portion, wherein, in the first position, the at least one porous filtration substrate portion is arranged in the airflow path providing a filtered flow path between the exterior space and the interior chamber, wherein, in the second position, the at least one porous filtration substrate portion is arranged outside of the airflow path providing an unfiltered flow path between the exterior space and the interior chamber.

19. The server of claim 18, wherein the at least one porous filtration substrate portion comprises a plurality of rectangular filters pivotally attached to the enclosure, wherein, upon receiving a filter-disengage control signal from a controller, the actuator moves from the first position to the second position pivoting the plurality of rectangular filters relative to the air inlet and out of the airflow path, wherein, upon receiving a filter-engage control signal from the controller, the actuator moves from the second position to the first position pivoting the plurality of rectangular filters relative to the air inlet and into the airflow path, wherein in the second position, the plurality of rectangular filters are arranged adjacent the inlet port.

20. The server of claim 19, wherein the plurality of rectangular filters comprise a high efficiency particle air (HEPA) filter substrate, and wherein the HEPA filter substrate comprises an average particle filtration size between 0.3 microns and 5.0 microns.

* * * * *